(12) United States Patent
Takagi et al.

(10) Patent No.: US 10,767,260 B2
(45) Date of Patent: Sep. 8, 2020

(54) SUBSTRATE PROCESSING APPARATUS, VAPORIZATION SYSTEM AND MIST FILTER

(71) Applicant: HITACHI KOKUSAI ELECTRIC INC., Tokyo (JP)

(72) Inventors: Kosuke Takagi, Toyama (JP); Atsushi Hirano, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 148 days.

(21) Appl. No.: 15/919,002

(22) Filed: Mar. 12, 2018

(65) Prior Publication Data

US 2018/0274093 A1 Sep. 27, 2018

(30) Foreign Application Priority Data

Mar. 27, 2017 (JP) ................. 2017-061400

(51) Int. Cl.
*C23C 16/40* (2006.01)
*C23C 16/44* (2006.01)
(Continued)

(52) U.S. Cl.
CPC ........ *C23C 16/4402* (2013.01); *C23C 16/405* (2013.01); *C23C 16/448* (2013.01);
(Continued)

(58) Field of Classification Search
CPC .......... F25B 37/00; F25B 39/00; F25B 39/02; F25B 39/04; F25B 40/00; F25B 41/00;
(Continued)

(56) References Cited

U.S. PATENT DOCUMENTS 7,883,076 B2* 2/2011 Okabe .................... F22B 1/287
261/100
10,147,597 B1* 12/2018 Lee ................... H01L 21/02104
(Continued)

FOREIGN PATENT DOCUMENTS

JP 08-270430 A 10/1996
JP 2005-252100 A 9/2005
(Continued)

OTHER PUBLICATIONS

Korean Office Action dated Aug. 16, 2019 for the Korean Patent Application No. 10-2018-0027378.
(Continued)

*Primary Examiner* — Rudy Zervigon
(74) *Attorney, Agent, or Firm* — Volpe and Koenig, P.C.

(57) ABSTRACT

A substrate processing apparatus includes a process chamber accommodating a substrate; a gas supply system; and an exhaust system. The supply system includes a vaporizer and a mist filter, the mist filter including a plurality of first plates and a plurality of second plates. Each of the first plates includes a first plate portion having a plurality of first grooves on a surface thereof and a first flow path. Each of the second plates includes a second plate portion having a plurality of second grooves on a surface thereof and a second flow path. When the plurality of first and second plates are arranged alternatively, the plurality of first grooves are configured to face the second flow path and the plurality of second grooves are configured to face the first flow path, such that the first flow path and the second flow path are not in-line.

13 Claims, 13 Drawing Sheets

(51) Int. Cl.
*C23C 16/448* (2006.01)
*H01L 21/67* (2006.01)
*C23C 16/455* (2006.01)
*B01D 50/00* (2006.01)
*B01D 45/08* (2006.01)

(52) U.S. Cl.
CPC .. *C23C 16/45544* (2013.01); *C23C 16/45578* (2013.01); *H01L 21/67017* (2013.01); *B01D 45/08* (2013.01); *B01D 50/002* (2013.01)

(58) Field of Classification Search
CPC ............... F25B 43/00; C23C 16/4402; C23C 16/45544; C23C 16/405; C23C 16/45578; C23C 16/448; H01L 21/67017; B01D 45/08; B01D 50/002
USPC ...................................... 118/726; 156/345.29
See application file for complete search history.

(56) References Cited

U.S. PATENT DOCUMENTS

| | | |
|---|---|---|
| 2009/0064669 A1 | 3/2009 | Mabuchi et al. |
| 2013/0267100 A1 | 10/2013 | Takagi et al. |
| 2014/0157737 A1 | 6/2014 | Schleiden et al. |
| 2014/0182515 A1* | 7/2014 | Yamazaki ........... C23C 16/4481 118/722 |

FOREIGN PATENT DOCUMENTS

| | | |
|---|---|---|
| JP | 2009-062928 A | 3/2009 |
| JP | 2013-232624 A | 11/2013 |
| KR | 10-2014-0082629 A | 7/2014 |

OTHER PUBLICATIONS

Japanese Office Action dated Mar. 12, 2020 for the Japanese Patent Application No. 2017-061400.
Japanese Office Action dated Dec. 13, 2019 for the Japanese Patent Application No. 2017-061400.
Korean Office Action dated Feb. 28, 2020 for the Korean Patent Application No. 10-2018-0027378.

* cited by examiner

FIG. 6
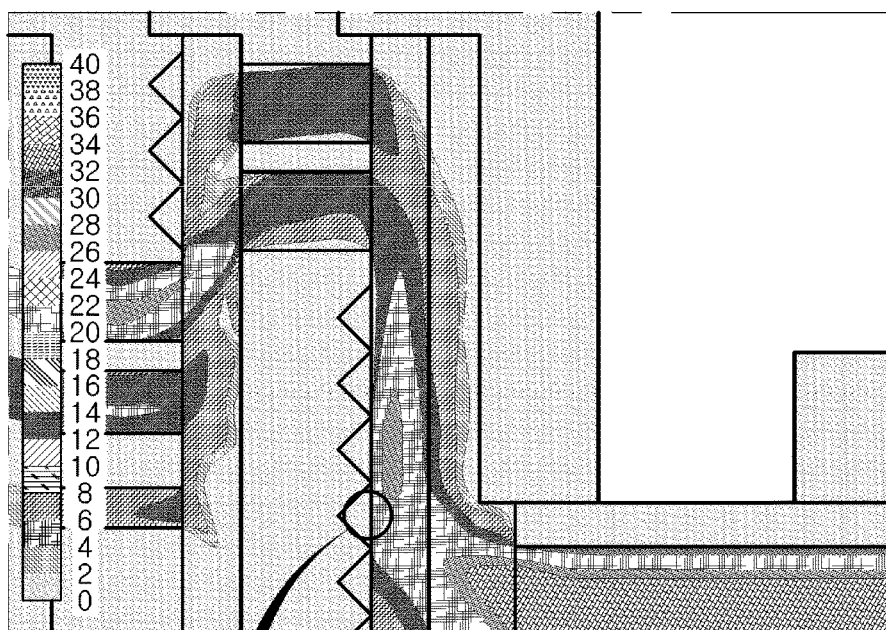
ENLARGED VIEW
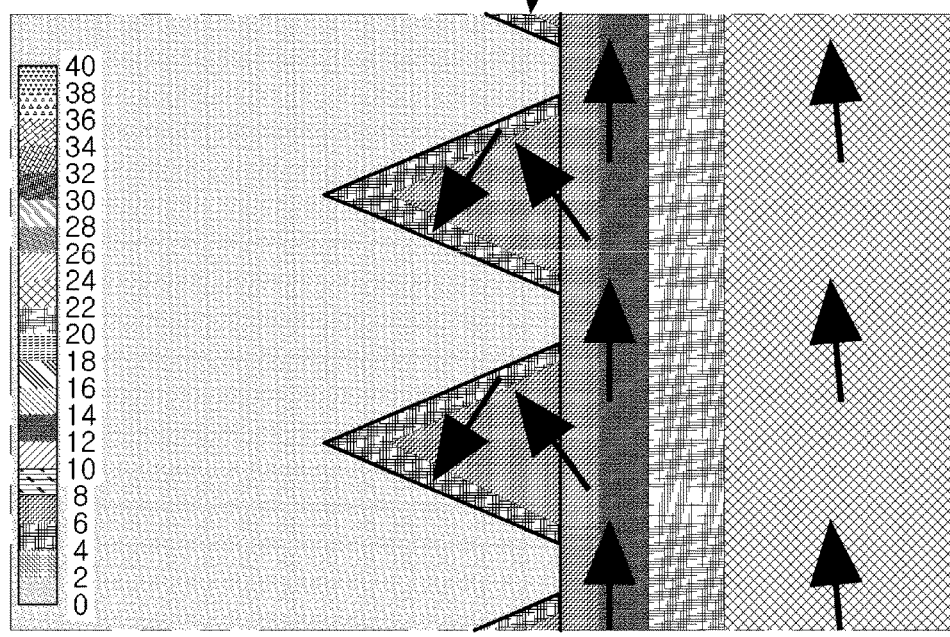

SUBSTRATE PROCESSING APPARATUS, VAPORIZATION SYSTEM AND MIST FILTER

CROSS-REFERENCE TO RELATED PATENT APPLICATION

This non-provisional U.S. patent application claims priority under 35 U.S.C. § 119 of Japanese Patent Application No. 2017-061400, filed on Mar. 27, 2017, the entire contents of which are hereby incorporated by reference.

BACKGROUND

1. Field

The present disclosure relates to a substrate processing apparatus for processing a wafer using a liquid source and a vaporization system and a mist filter preferably used in the substrate processing apparatus.

2. Description of the Related Art

As one of manufacturing processes of a semiconductor device, a conventional technique of forming a film on a substrate using a liquid source is known in the art. In particular, a technique capable of resolving problems such as incomplete vaporization by increasing the length of a gas path wherethrough a vaporized source (including the source in mist state) flows is known in the art.

However, when a film is formed on a wafer using the vaporized source, the problem such as incomplete vaporization may still occur when the flow rate of the source is high resulting in the generation of particles or re-liquefaction of the vaporized source gas.

SUMMARY

Described herein is a technique capable of efficiently vaporizing a liquid source supplied into a process chamber.

According to one aspect of the technique described herein, there is provided a substrate processing apparatus including: a process chamber accommodating a substrate; a process gas supply system configured to supply a process gas into the process chamber; and an exhaust system configured to exhaust the process chamber; wherein the process gas supply system includes: a vaporizer and a mist filter provided at a downstream side of the vaporizer, the mist filter including: a plurality of first plates and a plurality of second plates, each of the plurality of first plates including: a first plate portion provided with a plurality of first grooves provided on a surface thereof and a first flow path wherethrough a source in mist state flows, each of the plurality of second plates including: a second plate portion provided with a plurality of second grooves provided on a surface thereof and a second flow path wherethrough the source in mist state flows, and wherein when the plurality of first plates and the plurality of second plates are arranged the plurality of first grooves and the plurality of second grooves face the second flow path and the first flow path, respectively, such that the first flow path and the second flow path are not in-line.

BRIEF DESCRIPTION OF THE DRAWINGS

FIG. 6 illustrates simulation results of the mist filter shown in FIG. 3.

DETAILED DESCRIPTION

Hereinafter, embodiments will be described with reference to the FIGS. 1A through 13.

First, a source supply system preferably used in the embodiment will be described.

As the amount of source supplied to the vaporizer increases, the amount of droplets due to incomplete vaporization also increases. While it is preferable that the droplets are completely vaporized in a component such as a pipe connecting the vaporizer and the process chamber, the droplet due to the incomplete vaporization having a diameter larger than the diameter of the particle generated by spraying using a conventional atomizer is likely to be supplied into the process chamber. While a gas filter may be installed at the supply line between the process chamber and the vaporizer, the gas filter is not capable of filtering droplets with large diameters. As a result, the droplets are accumulated in the gas filter and pass through the gas filter in liquid state. The droplets passed through the gas filter act as an impurity when supplied onto the wafer.

As described above, when a source gas in gaseous state obtained by vaporizing a liquid source is used to perform a process such as film deposition on a semiconductor wafer, there is a problem that particles or impurities are generated on the wafer. The inventors of the present invention have studied the above problems and obtained the following findings.

Figure 1:
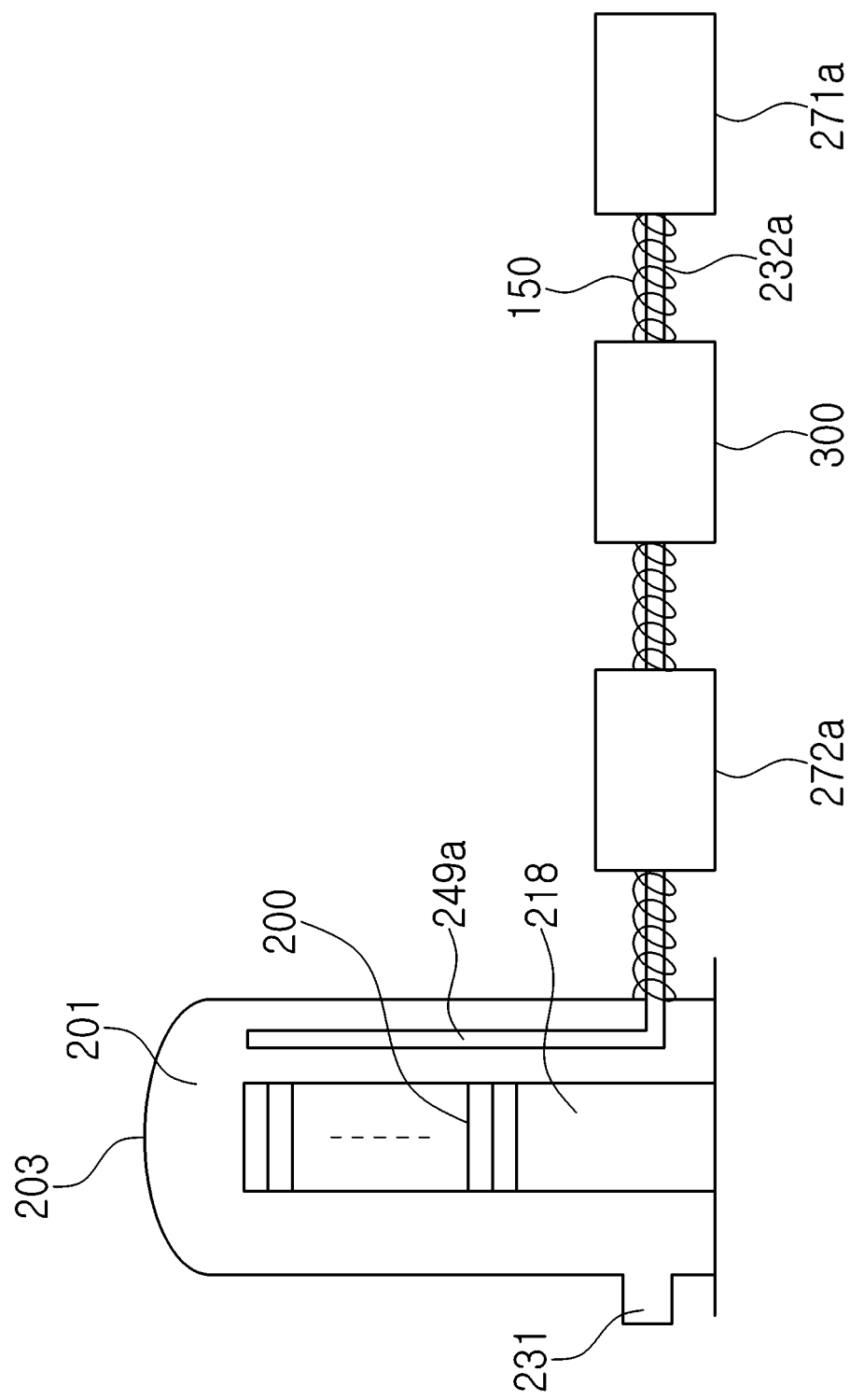
FIG. 1 schematically illustrates a source supply system according to an embodiment described herein.
Figure 2:
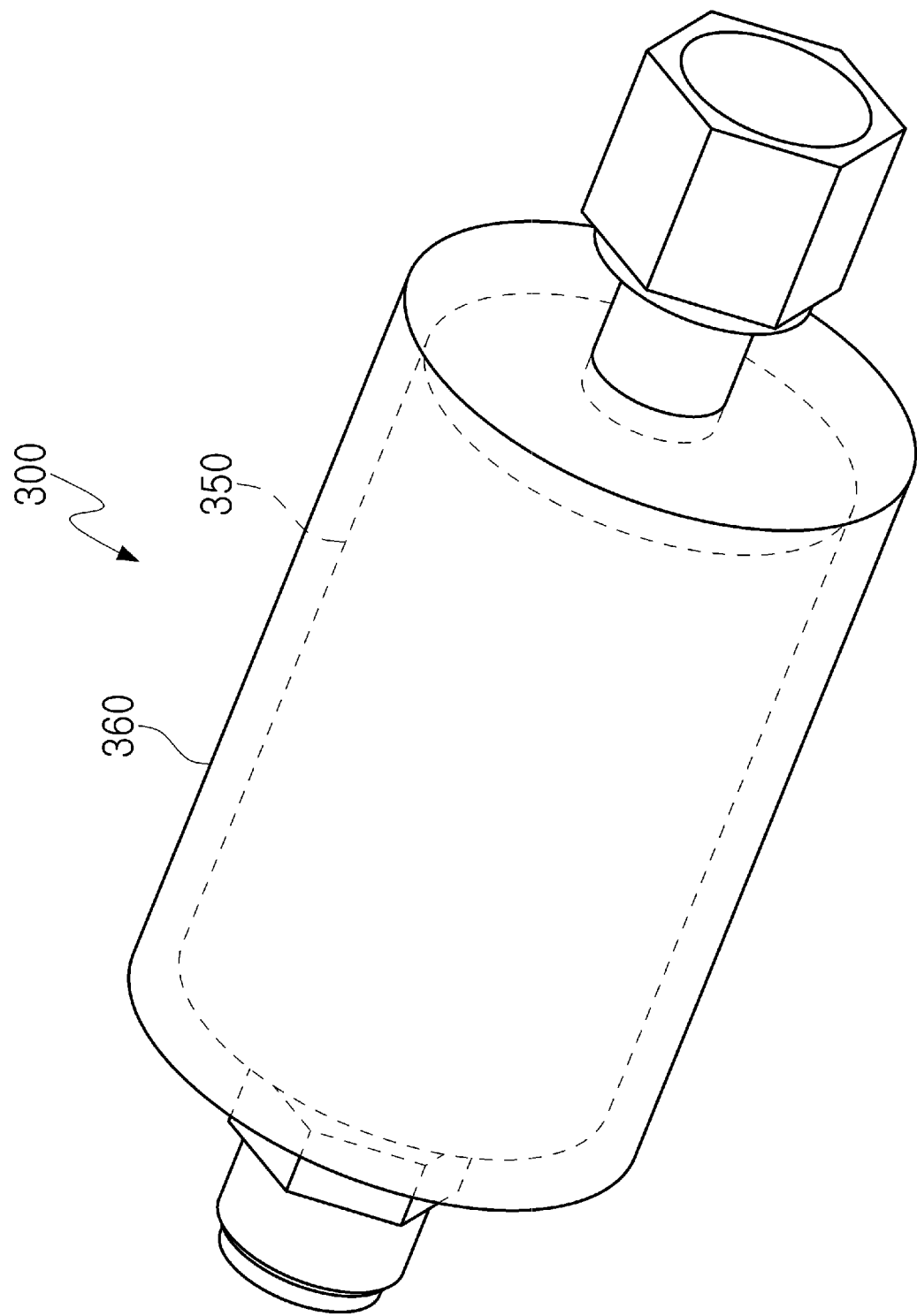
FIG. 2 schematically illustrates a mist filter according to the embodiment.

As shown in FIG. 1, a mist filter (also referred to as a mist killer) 300 is provided at a gas supply pipe 232*a* between a vaporizer 271*a* and a gas filter 272*a*. A heater 150 is provided at the gas supply pipe 232*a* between the vaporizer 271*a* and the process chamber 201. The heater 150 is configured to heat a source gas passing through the gas supply pipe 232a. Referring to FIG. 2, the mist filter 300 includes a mist filter body 350 and a heater 360 covering the mist filter body 350 provided outside thereof.

Figure 3:
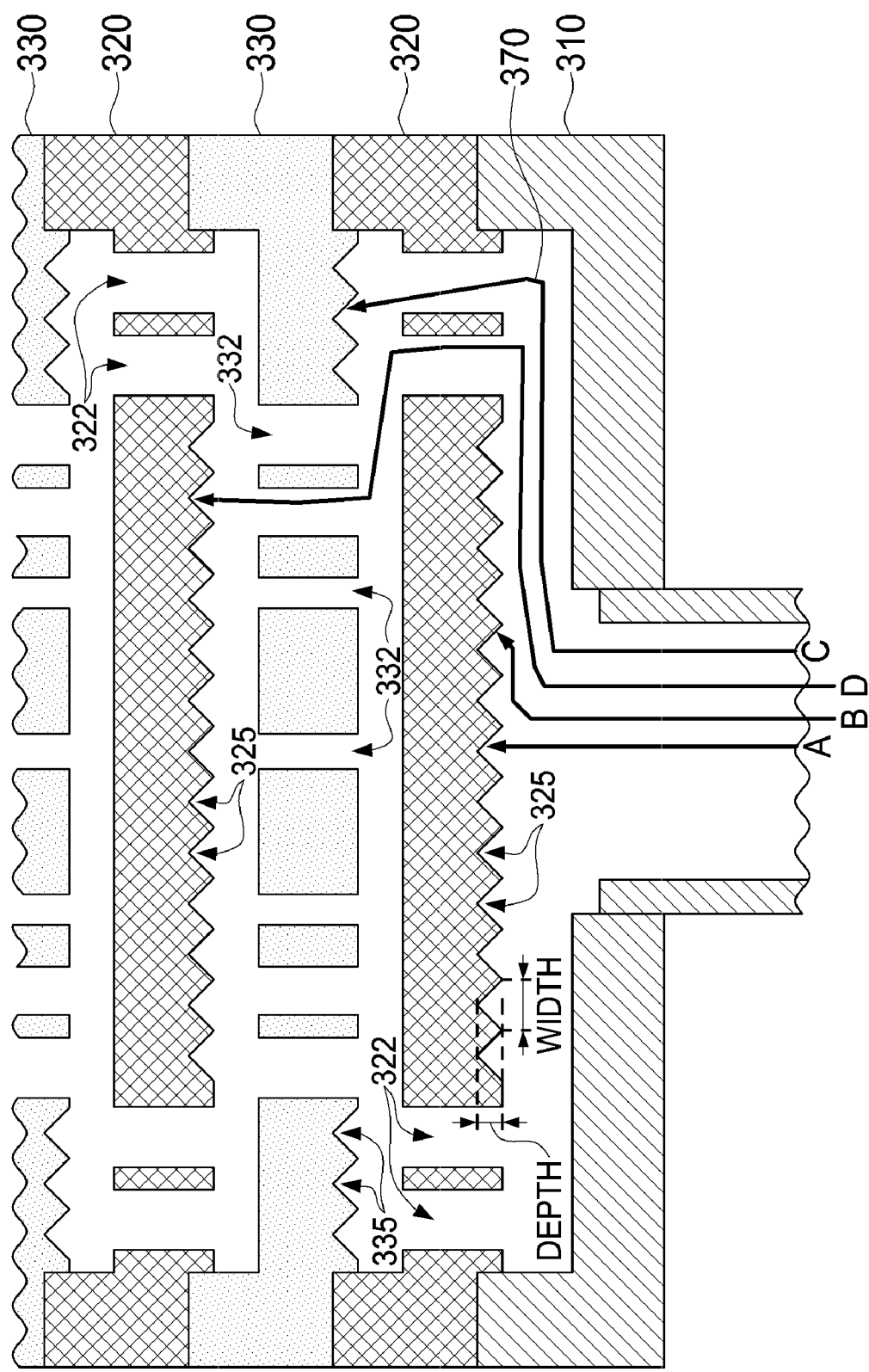
FIG. 3 schematically illustrates a partial enlarged view of a cross-section of the mist filter according to the embodiment along with flows of a source therein.
Figure 4:
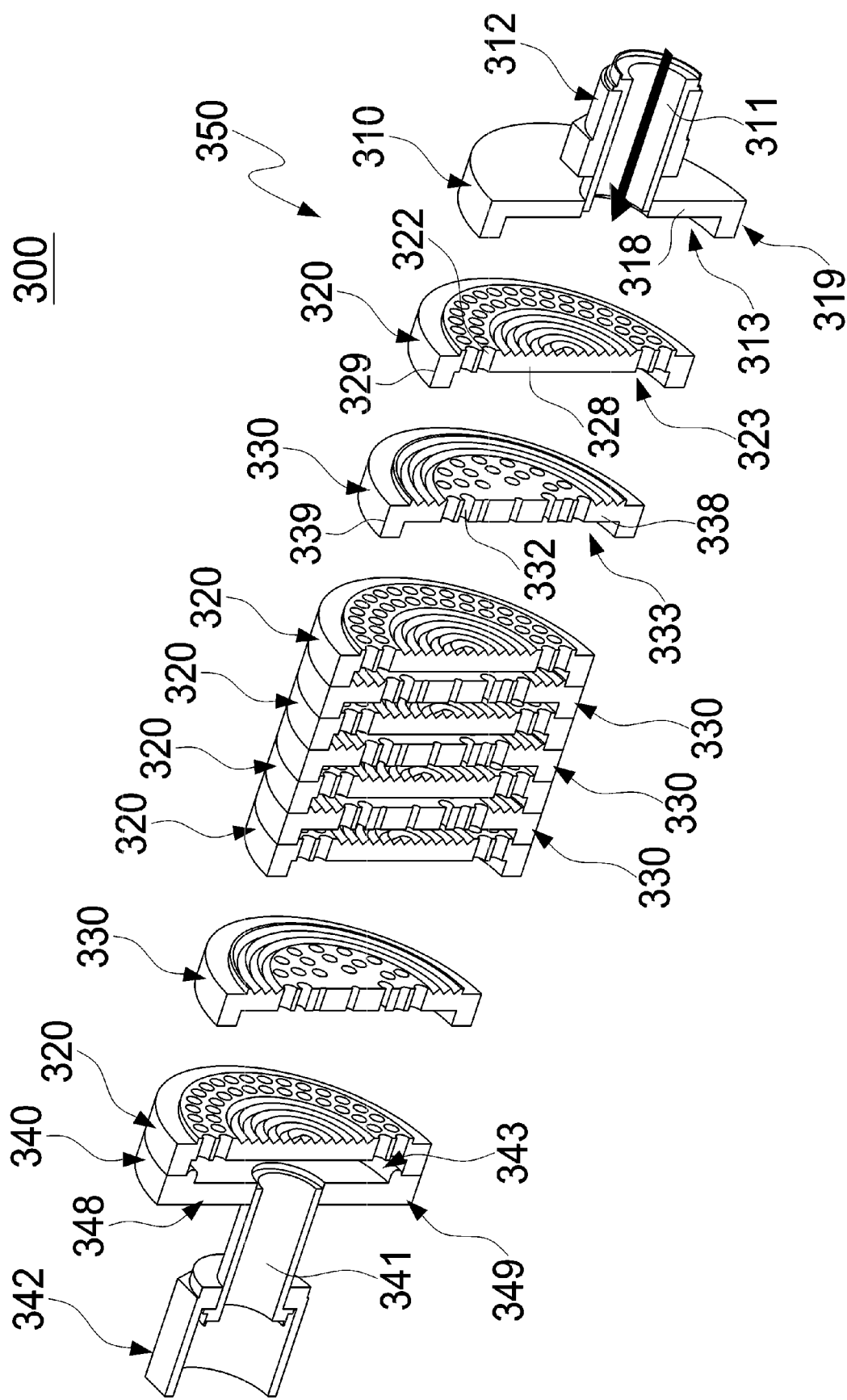
FIG. 4 schematically illustrates an exploded view of the mist filter according to the embodiment.
Figure 5:
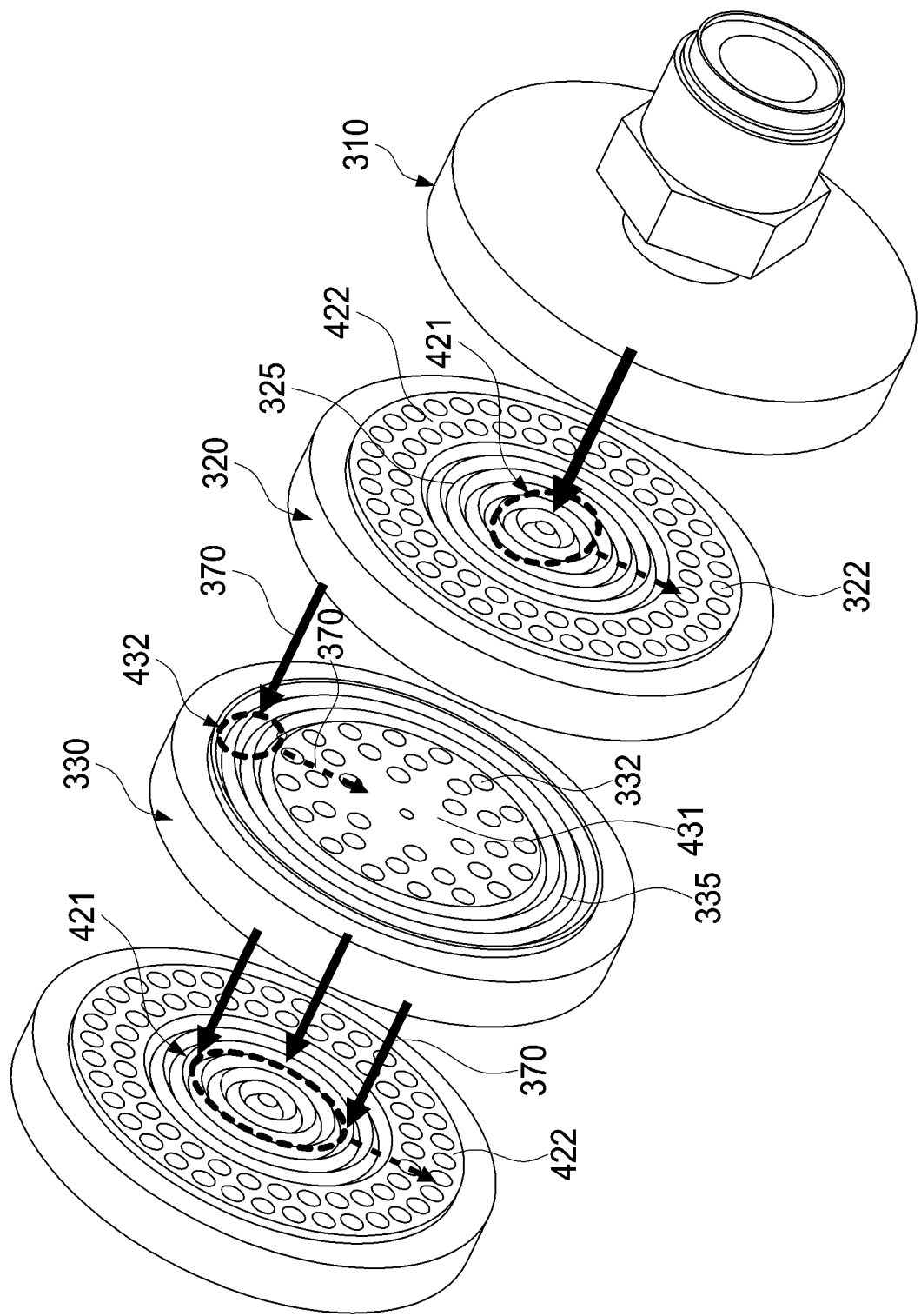
FIG. 5 is a partial enlarged view of the mist filter according to the embodiment.

Referring to FIGS. 3 through 5, the mist filter body 350 of the mist filter 300 includes end plates 310 and 340 (also referred to as upstream end plate 310 and downstream end plate 340, respectively) provided at both ends of the mist filter 300 and plates 320 and 330 (also referred to as first type plate 320 and second type plate 330, respectively) provided between the plates 310 and 340. Joints 312 and 342 are provided at the upstream end plate 310 and the downstream end plate 340, respectively. A gas path (also referred to as a flow path, hereinafter) 311 is provided in the end plate 310 and the joint 312. A gas path (also referred to as a flow path, hereinafter) 341 is provided in the end plate 340 and the joint 342. The mist filter body 350 is provided at the gas supply pipe 232a such that the joint 312 and the joint 342 (the gas path 311 and the gas path 341) are connected to the gas supply pipe 232a.

A plurality of the first type plates 320 and a plurality of the second type plates 330 are provided, and the first type plate 320 and the second type plate 330 are alternately arranged between the end plates 310 and 340. The plate 320 has a plate-shaped center portion (first plate portion) 328 and a first circumferential portion 329 provided along the periphery of the first plate portion 328. A plurality of holes 322, which is a first flow path, are provided only at a peripheral portion 422 of the first plate portion 328, and grooves 325 are provided at the entirety of an center portion 421 of the first plate portion 328 other than the peripheral portion 422 of the first plate portion 328. The plate 330 has a plate-shaped center portion (second plate portion) 338 and a second peripheral portion 339 provided along the periphery of the second plate portion 338. A plurality of holes 332, which is a second flow path, are provided only at a center portion 431 of the second plate portion 338 such that the plurality of holes 332 are not in-line with the plurality of holes 322, and grooves 335 are provided at the entirety of a peripheral portion 432 of the second plate portion 338 other than the center portion 431 of the second plate portion 338. The mist filter 300 is constituted by alternately arranging (or stacking) the plurality of the plates 320 and the plurality of the plates 330.

The first type plate 320 and the second type plate 330 have the same or substantially the same shape except for the holes 322 and 332 and the grooves 325 and 335. That is, the plate portion 328 and the plate portion 338 have the same or substantially the same disc shape except for the holes 322 and 332 and the grooves 325 and 335. The holes 322 are concentrically arranged at the peripheral portion 422 of the first plate portion 328 and the first grooves 325 are concentrically arranged on the surface of the center portion 421 of the first plate portion 328 to form an uneven surface.

The holes 332 are concentrically arranged on the center portion 431 of the second plate portion 338 and the second grooves 335 are concentrically arranged on the surface of the peripheral portion 432 of the second plate portion 338 to form an uneven surface. According to the embodiment, the radii of the circles along which the holes 322 are arranged differ from those of the circles along which the holes 332 are arranged, and the radii of the circles along which the first grooves 325 are arranged differ from those of the circles along which the second grooves 335 are arranged.

Specifically, the radii of the circles along which the holes 322 are arranged are larger than those of the circles along which the holes 332 are arranged, and the radii of the circles along which the first grooves 325 are arranged are smaller than those of the circles along which the second grooves 335 are arranged. That is, the region of the plate portion 328 where the holes 322 are provided does not face that of the plate portion 338 where the holes 332 are provided, and the region of the plate portion 328 where the first grooves 325 are provided does not face that of the plate portion 338 where the second grooves 335 are provided.

When the first type plate 320 and the second type plate 330 are alternately arranged (stacked), the region of the plate portion 328 where the holes 322 are provided is not in-line with the region of the plate portion 338 where the holes 332 are provided, and the region of the plate portion 328 where the first grooves 325 are provided is not in-line with the region of the plate portion 338 where the second grooves 335 are provided. By alternately arranging the first type plate 320 and the second type plate 330, holes 322 and 332 and grooves 325 and 335 are not in-line (does not overlap) with each other from the upstream side to the downstream side of the mist filter 300.

Although the width and the depth of each of the grooves 325 and 335 may vary depending on the number of grooves, it is preferable that the depth ranges from 0.5 to 2.0 with respect to the width of 1.0. FIG. 3 is an enlarged view of a cross-section of the mist filter for illustrating a flow of the source in the mist filter. In FIG. 3, the grooves 325 and 335 having a width of 2 mm and a depth of 1 mm are illustrated for example. The depth and the width shown in FIG. 3 are illustrative, and the width and the depth of the groove are not limited thereto. Hereinafter, a gas path 370 through which the source in mist state (mists A through D) shown in FIG. 3 pass will be described with reference to FIGS. 3 through 5. For convenience, the diameter of the droplets in the source in mist state is assumed to be mist A>mist B>mist C>mist D.

The force applied to a particle (droplet) in the source in mist state dependent upon the diameter of the droplet. Referring to FIG. 3, relatively large droplets (for example, 30 μm to 100 μm in diameter) in mist A and mist B are subjected to a relatively large force. Therefore, the direction of the relatively large droplets cannot easily change even when the flow direction of the gas in the source in mist state changes, and the relatively large droplets is likely to move in the same direction even after the flow direction of the gas in the source in mist state changes. For example, if the flow direction of the gas changes near the plate portion 328, the droplets in the source in mist state collide against the plate portion 328, and the droplets breaks into small droplets, e.g., into droplets having a diameter of 30 μm. That is, the droplets in the mist A or the mist B collided against the plate portion 328 are divided into small droplets, and the small droplets are scattered. The scattered droplets move along the flow direction of the gas. The uneven surface having the V-shaped first grooves 325 shown in FIG. 3 promotes the increase in the flow velocity of the droplets and the scatter of the small droplets. As a result, the effect of collecting the droplets is enhanced.

Relatively small droplets (e.g., less than 30 μm in diameter) in the mist C and the mist D are subjected to a relatively small force. Therefore, the relatively small droplets are less likely to collide with the plate portions 328 and 338 even within the zigzag gas path 370 shown in FIG. 3. However, by drastically changing the flow velocity of the source in mist state or by changing the flow direction of the source in mist state multiple times, it is possible to increase the rate of the relatively small droplets colliding against the plate portions 328 and 338, thereby enhancing the effect of collecting the droplet.

According to the embodiment, the mist filter 300 (mist filter body 350) includes: the plate portion 322 having the center portion 421 provided with the holes 322 and the peripheral portion 422 provided with the first grooves 325; and the plate portion 332 having the center portion 421 provided with the second grooves 335 and the peripheral portion 422 provided with the holes 332. The plate portion 328 and the adjacent plate portion 338 are alternately arranged such that the holes 322 and the holes 333 constituting the gas path 370 are not in-line with each other. In the mist filter 300, the source in mist state alternately passes through the holes 322 of the plate portion 328 and the holes 332 of the plate portion 338. As the source in mist state flows from the plate portion 328 toward the plate portion 338, the flow direction of the source changes, and the grooves 325 and 335 are provided at the locations where the flow direction of the source changes. For example, the source in mist state introduced into the mist filter body 350 through the gas path 311 first collides with the first grooves 325 provided in the plate portion 328.

The grooves 325 and 335 increase the surface area of the plate portions 328 and 338 which come in contact with the source in mist state, thereby improving the vaporization efficiency of the source in mist state. The grooves 325 and 335 also reduce the flow velocity of the source in mist state by generating a vortex in the source in mist state. Therefore, the heating time sufficient for heating the source is obtained to completely vaporize the source in mist state and the vaporization efficiency is remarkably improved.

Each of the grooves 325 and 335 may have but not limited to a shape of rectangular or trapezoidal or a U-shape as long as the overall surface is uneven (e.g., saw tooth shape). It is preferable that the depth-to-width ratio of each of the grooves 325 and 335 ranges from 0.5 to 2, and that the opening angle of each of the grooves 325 and 335 ranges from 60 to 120 degrees. The grooves 325 and 335 may be equally and concentrically spaced apart.

FIG. 6 is a partial enlarged view of the simulation results of the mist filter 300 of FIG. 3. As shown in FIG. 6, the droplets that are not vertically incident on the grooves 325 and 335 move to form a vortex in the grooves 325 and 335 such that the effect of collecting the droplets is be enhanced.

Preferably, the circumferential portions 329 and 339 are thicker than the plate portions 328 and 338, respectively, and the circumferential portion 329 of the plate 320 is in contact with the circumferential portion 339 of the adjacent plates 330. Therefore, a space is defined between the plate portions 328 and 338. The circumferential portions 329 and 339 are provided at offset positions with respect to the plate portions 328 and 338, respectively. Specifically, as shown in FIG. 3, the top surfaces of the circumferential portions 329 and 339 are higher than those of the plate portions 328 and 338, respectively, and the bottom surfaces of the circumferential portions 329 and 339 are also higher than those of the plate portions 328 and 338, respectively. Accordingly, when the first type plate 320 and the second type plate 330 are stacked, the upper inner surface of the circumferential portion 329 of the first type plate 320 comes in contact with the lower outer surface of the plate portion 338 of the second type plate 330, and the upper inner surface of the circumferential portion 339 of the second type plate 330 comes in contact with the lower outer surface of the plate portion 328 of the first type plate 320 such that the plates 320 and 330 are aligned.

The complex gas path 370 is formed by alternately arranging the plates 320 and 330 to increase the rate of the droplets due to incomplete vaporization or re-liquefaction colliding with the heated plate portions 328 and 338. The diameters of the holes 322 and 332 are selected according to the inner pressure of the mist filter body 350. Preferably, the diameter of each of the holes 322 and 332 ranges from 1 mm to 3 mm. When the diameter of each of the holes 322 and 332 is too small, the holes 322 and 332 may be clogged. It is preferable that the diameter of each of the holes 322 and 332 is equal to or greater than 1 mm. The holes 332 that are near the center of the second plate portion 338 may have a smaller diameter than the holes 332 that are far from the center of the second plate portion 338.

The source in gaseous state (source gas) obtained from vaporizing liquid source by the vaporizer 271*a* shown in FIG. 1 and the droplet generated due to incomplete vaporization or re-liquefaction flow into the mist filter body 350 through the end plate 310 and the path 311 in the joint 312. Thereafter, the source gas and the droplet pass through the holes 322 provided in the peripheral portion 422 of the plate portion 328 of first one of the first type plates 320 after colliding with the center portion 421 (where the first grooves 325 are provided) of the plate portion 328 of the first one of the first type plates 320. Thereafter, the source gas and the droplet pass through the holes 332 provided in the center portion 431 of the plate portion 338 of first one of the second type plates 330 after colliding with the peripheral portion 432 (where the second grooves 335 are provided) of the plate portion 338 of the second one of the second type plates 330. Thereafter, the source gas and the droplet collide with the center portion 421 (where the first grooves 325 are provided) of the plate portion 328 of the first one of the first type plates 320. Thereafter, the source gas and the droplet pass through the plates 330 and 320 in order and flow out of the mist filter body 350 through the end plate 340 and the gas path 341 in the joint 342 to the gas filter 272*a* shown in FIG. 1.

The mist filter body 350 is heated from the outside thereof by the heater 360 shown in FIG. 2. As described above, the mist filter body 350 includes the first type plates 320 including the plate portion 328 and the circumferential portion 329 and the second type plates 330 including the plate portion 338 and the circumferential portion 339. The plate portion 328 and the circumferential portion 329 are integrally formed and the plate portion 338 and the circumferential portion 339 are integrally formed such that the heat is efficiently transferred to the plate portions 328 and 338 when the mist filter body 350 is heated. Even when the plate portion 328 and the circumferential portion 329 are not integrally formed and the plate portion 338 and the circumferential portion 339 are not integrally formed, heat may be efficiently transferred to the plate portions 328 and 338 as long as the plate portion 328 and the circumferential portion 329 or the plate portion 338 and the circumferential portion 339 are in complete contact with each other.

As described above, the complex gas path 370 is defined in the mist filter body 350 by the first type plates 320 and the second type plates 330. The grooves 325 and 335 are provided at an extension of the gas path 370 from the first type plate 320 to the second type plate 330 and at the extension of the gas path 370 from the second type plate 330 to the first type plate 320. Therefore, it is possible to increase the probability of collision of the source gas which has been vaporized to a gaseous state and the droplets caused by poor vaporization or re-liquefaction to the heated flat plate-like plates 328 and 338. The droplets due to incomplete vaporization or re-liquefaction are reheated and vaporized by colliding with the heated plate portions 328 and 338 in the mist filter body 350. The droplets colliding with the plate portions 328 and 338 form vortics in the grooves 325 and 335, whereby the flow velocity decreases. As a result, the vaporization efficiency in the mist filter body 350 is remarkably improved.

The mist filter body 350 is configured to overlap at least two types of the plurality of plate portions 328 and 338 having holes 322,332 and grooves 325,335 at different locations of the main surfaces thereof, and includes the gas path 370 between the two adjacent plate portions 328 and 338 is longer in the direction parallel to the main surface than in the direction perpendicular to the main surface. By increasing the length of the gas path 370 in the mist filter body 350 to improve the collection efficiency for the droplets by the grooves 325 and 335 while decreasing the flow velocity of the droplets, the droplets are further heated by the heater 360. Since sufficient heat is applied to the droplets, the efficiency of vaporizing the droplets is significantly improved. In the embodiment, the main surface refers to the surface of the plate portions 328 and 338 on which the grooves 325 and 335 are provided.

The mist filter body 350 is preferably made of a material having a thermal conductivity equal to or higher than the material of the vaporizer 271a or the gas supply pipe 232a. It is preferable that the mist filter body 350 is corrosion-resistant. The mist filter body 350 may be made of, for example, stainless steel (SUS).

The mist filter 300 provided at the gas supply pipe 232a between the vaporizer 271a and the gas filter 272a as shown in FIG. 2 enables re-heating and vaporization of droplets by the collision of droplets onto the plate portion 328 of the first type plate 320 and the plate portion 338 of the second type plate 330 in the mist filter 300 even for the source having a large amount and the source that is difficult to vaporize. The gas filter 272a collects remaining droplets due to incomplete vaporization and particles generated in the vaporizer 271a and the mist filter 300 before remaining droplets and the particles reaches the process chamber 201. The mist filter 300 assists vaporization such that a reactive gas free of droplets and particle is supplied into the process chamber 201. As a result, a high quality film-forming process can be performed. The mist filter 300 also assists the gas filter 272a such that the gas filter 272a is prevented from being clogged. As a result, the gas filter 272a may be maintenance-free and the life of the gas filter 272a may be extended.

As described above, the first type plate 320 includes the plate portion 328 and the circumferential portion 329, and the second type plate 330 includes the plate portion 338 and the circumferential portion 339 as shown in FIG. 4. The end plate 310 includes a plate portion 318 and a circumferential portion 319 provided along the circumference of the plate portion 318. The end plate 340 includes a plate portion 348 and a circumferential portion 349 provided along the circumference of the plate portion 348 as shown in FIG. 4. The spaces 323, 333, 313 and 343 shown in FIG. 4 are defined by inner surface of the circumferential portions 329, 339, 319 and 349, respectively. The end plate 310, the end plate 340, the first type plate 320 and the second type plate 330 are hermetically coupled to the circumferential portions 319, 349, 329 and 339, respectively, by welding for example. While the mist filter 300 including the first type plate 320 and the second type plate 330 is described above, the mist filter 300 is not limited thereto. For example, the mist filter 300 may include three or more types of plates having holes at different locations.

As shown in FIG. 1, the gas supply pipe 232a may be provided between the vaporizer 271a and the mist filter 300 such that the vaporizer 271a is separated from and the mist filter 300. The mist filter 300 is provided at a lower pressure side than the vaporizer 271a since the mist filter 300 is closer to the process chamber 201, which is in depressurized state, than the vaporizer 271a. Since the gas flows from high pressure side to low pressure side, the gas may have a foreflow section from the vaporizer 271a toward the mist filter 300 due to the separation of the vaporizer 271a from the mist filter 300. As a result, the gas collides with the first type plate 320 and the second type plate 330 at a greater flow velocity in the mist filter 300.

As shown in FIG. 1, the mist filter 300 is provided at the downstream side of the vaporizer 271a, the gas filter 272a is provided at the downstream side of the mist filter 300, and the gas filter 272a is connected to the process chamber 201 via the supply pipe 232a. According to the relationship of the pressure loss in the gas supply pipe 232a extending from the vaporizer 271a to the process chamber 201, the inner pressure of the filter 300 can be further lowered as the mist filter 300 and the gas filter 272a are closer to the process chamber 201. Therefore, it is preferable that the mist filter 300 and the gas filter 272a are installed as close as possible to the process chamber 201. Lower inner pressure of the mist filter 300 further facilitates the vaporization of the droplets and the suppression of the incomplete vaporization.

Hereinafter, a substrate processing apparatus according to the embodiment will be described with reference to the FIGS. 9 through 11. The substrate processing apparatus according to the embodiment may be a semiconductor manufacturing apparatus for performing film-forming process which is a substrate processing in manufacturing of an IC (Integrated Circuit) which is a semiconductor device. Hereinafter, a batch type vertical apparatus which is the substrate processing apparatus for performing process such as oxidation, nitridation, diffusion process and CVD process will be described. The batch type vertical apparatus may be simply referred to as a processing apparatus.

Figure 9:
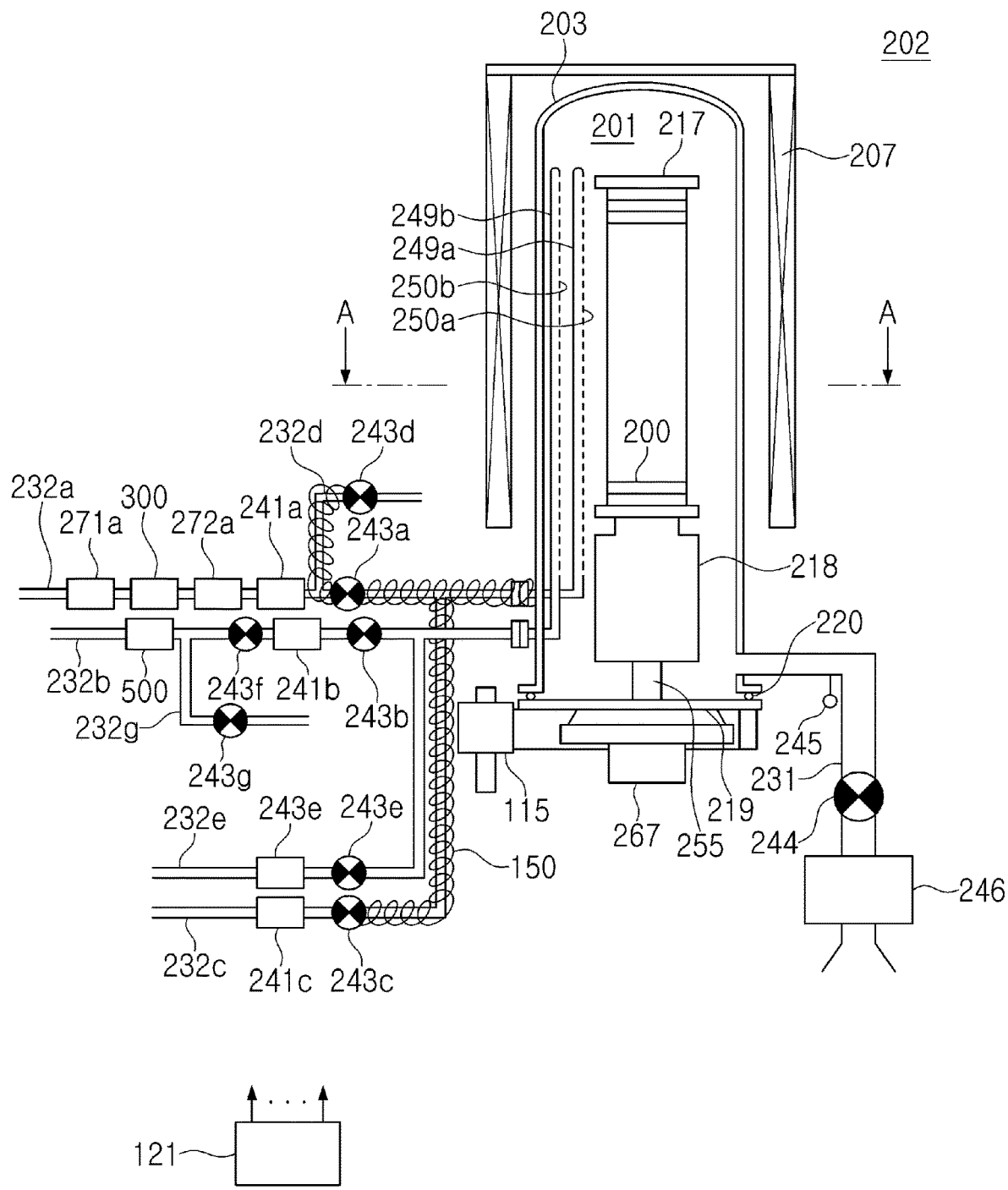
FIG. 9 schematically illustrates a vertical cross-section of a substrate processing apparatus according to the embodiment.
Figure 10:
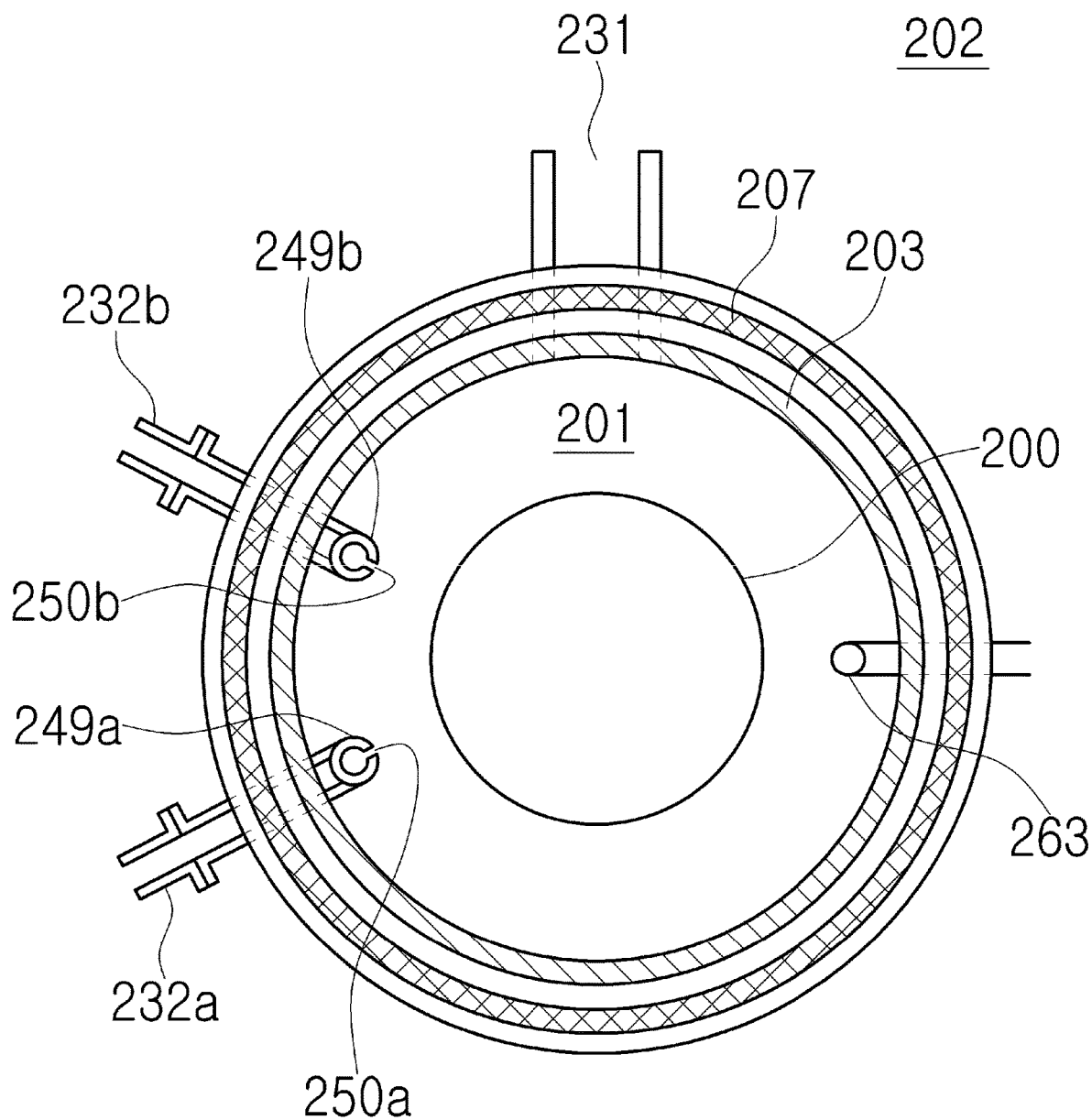
FIG. 10 schematically illustrates a cross-section taken along the line A-A of the substrate processing apparatus shown in FIG. 9.

FIG. 9 schematically illustrates a vertical cross-section of a process furnace 202 of the substrate processing apparatus preferably used in the embodiment. FIG. 10 schematically illustrates a horizontal cross-section taken along the line A-A of the process furnace 202 of the substrate processing apparatus shown in FIG. 9. FIG. 11 is a block diagram schematically illustrating a configuration of a controller and components controlled by the controller of the substrate processing apparatus shown in FIG. 9.

As illustrated in FIG. 9, the process furnace 202 includes a heater 207 which is a heating mechanism (heating device). The heater 207 is cylindrical, and vertically installed while being supported by a heater base (not shown) which is a support plate. A reaction tube 203 constituting a reaction vessel (processing vessel) is provided in and concentric with the heater 207.

A seal cap 219, which is a furnace opening cover capable of airtightly sealing the lower end opening of the reaction tube 203, is provided under the reaction tube 203. The seal cap 219 is provided under the reaction tube 203 and is in contact with the lower end of the reaction tube 203. The seal cap 219 is made of metal such as SUS, and is a disk-shaped. An O-ring 220b, which is a sealing member, is provided on the upper surface of the seal cap 219 and is in contact with the lower end of the reaction tube 203. A rotating mechanism 267 configured to rotate a boat 217 described later is provided at the seal cap 219 opposite to a process chamber 201. A rotating shaft 255 of the rotating mechanism 267 is connected to the boat 217 through the seal cap 219. As the rotating mechanism 267 rotates the boat 217, the wafers 200 are rotated. The seal cap 219 may be moved upward/downward by a boat elevator 115, which is an elevating mechanism provided outside the reaction tube 203. When the seal cap 219 is moved upward/downward by the boat elevator 115, the boat 217 may be loaded into the process chamber 201 or unloaded from the process chamber 201.

The boat 217, which is a substrate retainer, is vertically provided on the seal cap 219 through a quartz cap 218 which is an insulating member. The quartz cap 218 is made of a heat-resistant material such as quartz and SiC. The quartz cap 218 also supports the boat 217 as well as being a thermal insulator. The boat 217 is made of a heat-resistant material such as quartz and SiC. The boat 217 supports concentrically arranged wafers in vertical direction while each of the wafers 200 are in horizontal orientation. That is, the boat 217 supports, in multiple stages, concentrically arranged the wafers 200.

Nozzles 249a and 249b are provided in the process chamber 201 through sidewalls of the reaction tube 203. Gas supply pipes 232a and 232b are connected to the respective nozzles 249a and 249b. As such, the two nozzles 249a and 249b and the two gas supply pipes 232a and 232b may be provided at the reaction tube 203, and supply plural kinds of gases into the process chamber 201. As described later, inert gas supply pipes 232c and 232e are connected to the gas supply pipes 232a and 232b, respectively.

The vaporizer 271a, which is a vaporizing device (vaporizing means) capable of vaporizing a liquid source to obtain a source gas, the mist filter 300, the gas filter 272a, a mass flow controller (MFC) 241a which is a flow rate controller (flow rate control unit) and a valve 243a which is an opening/closing valve are sequentially provided at the gas supply pipe 232a from the upstream side toward the downstream side of the gas supply pipe 232a. By opening the valve 243a, the source gas generated in the vaporizer 271a is supplied into the process chamber 201 via the nozzle 249a. A ventilation line 232d connected to an exhaust pipe 231, which will be described later, is connected to the gas supply pipe 232a between the MFC 241a and the valve 243a. A valve 243d, which is an on/off valve, is provided at the ventilation line 232d. When the source gas described below is not supplied to the process chamber 201, the source gas is supplied to the ventilation line 232d via the valve 243d. By closing the valve 243a and opening the valve 243d, the supply of the source gas into the process chamber 201 may be stopped even when the vaporizer 271a continues to generate the source gas. A certain amount of time is required to stably generate the source gas. The operation of the valve 243a and the valve 243d reduces the time required for switching between the supply of the source gas into the process chamber 201 and the suspending of the supply of the source gas. The inert gas supply pipe 232c is connected to the downstream side of the valve 243a. A mass flow controller (MFC) 241c which is a flow rate controller (flow rate control unit) and a valve 243c which is an opening/closing valve are sequentially installed at the inert gas supply pipe 232c from the upstream side toward the downstream side of the inert gas supply pipe 232c. The heater 150 is provided at the gas supply pipe 232a, the inert gas supply pipe 232c, and the ventilation line 232d to prevent re-liquefaction of the source gas.

The above-described nozzle 249a is connected to the front end portion of the gas supply pipe 232a. The nozzle 249a is provided in an annular space between the inner wall of the reaction tube 203 and the wafers 200, and extends from bottom to top of the inner wall of the reaction tube 203 along the stacking direction of the wafers 200. For example, the nozzle 249a includes an L-shaped long nozzle. A plurality of gas supply holes 250a for supplying gases is provided at side surfaces of the nozzle 249a. The gas supply holes 250a are open toward the center of the reaction tube 203. The gas supply holes 250a are provided from the lower portion of the reaction tube 203 to the upper portion thereof. The gas supply holes 250a have the same area and pitch.

A first gas supply system is constituted by the gas supply pipe 232a, the ventilation line 232d, the valves 243a and 243d, the MFC 241a, the vaporizer 271a, the mist filter 300, the gas filter 272a and the nozzle 249a. A first inert gas supply system is constituted by the inert gas supply pipe 232c, the MFC 241c and the valve 243c.

An ozonizer 500 capable of generating ozone ($O_3$) gas, a valve 243f, a mass flow controller (MFC) 241b which is a flow rate controller (flow rate control unit) and a valve 243b which is an opening/closing valve are sequentially installed at the gas supply pipe 232b from the upstream side toward the downstream side of the gas supply pipe 232b. An oxygen gas source (not shown) for supplying oxygen ($O_2$) gas is connected to the upstream side of the gas supply pipe 232b. $O_2$ gas supplied to the ozonizer 500 is converted into $O_3$ gas by the ozonizer 500 and $O_3$ gas is supplied into the process chamber 201. A ventilation line 232g connected to an exhaust pipe 231, which will be described later, is connected to the gas supply pipe 232b between the ozonizer 500 and the valve 243f. A valve 243g, which is an on/off valve, is provided at the ventilation line 232 g. When $O_3$ gas is not supplied to the process chamber 201, the $O_3$ gas is supplied to the ventilation line 232 g via the valve 243g. By closing the valve 243f and opening the valve 243g, the supply of $O_3$ gas into the process chamber 201 may be stopped even when the ozonizer 500 continues to generate $O_3$ gas. A certain amount of time is required to stably generate $O_3$ gas. The operation of the valve 243f and the valve 243g reduces the time required for switching between the supply of $O_3$ gas into the process chamber 201 and the suspending of the supply of $O_3$ gas. The inert gas supply pipe 232e is connected to the downstream side of the valve 243b. A mass flow controller (MFC) 241e which is a flow rate controller (flow rate control unit) and a valve 243e which is an opening/closing valve are sequentially installed at the inert gas supply pipe 232e from the upstream side toward the downstream side of the inert gas supply pipe 232e.

The above-described nozzle 249b is connected to the front end portion of the gas supply pipe 232ba. The nozzle 249b is provided in an annular space between the inner wall of the reaction tube 203 and the wafers 200, and extends from bottom to top of the inner wall of the reaction tube 203 along the stacking direction of the wafers 200. For example, the nozzle 249b includes an L-shaped long nozzle. A plurality of gas supply holes 250b for supplying gases is provided at side surfaces of the nozzle 249b. The plurality of gas supply holes 250b are open toward the center of the reaction tube 203. The plurality of gas supply holes 250b is provided from the lower portion of the reaction tube 203 to the upper portion thereof. The plurality of gas supply holes 250b has the same area and pitch.

A second gas supply system is constituted by the gas supply pipe 232b, the ventilation line 232g, the valves 243f, 243g and 243b, the MFC 241b and the nozzle 249b. A second inert gas supply system is constituted by the inert gas supply pipe 232e, the MFC 241e and the valve 243e.

A zirconium (Zr)-containing gas, that is, a gas containing zirconium (zirconium-containing gas) which is a first source gas, is supplied into the process chamber 201 via the vaporizer 271a, the mist filter 300, the gas filter 272a, the MFC 241a and the valve 243a, which are provided at the gas supply pipe 232a, and the nozzle 249a. For example, the zirconium-containing gas includes tetrakis(ethylmethylamino) zirconium (TEMAZ) gas. Tetrakis(ethylmethylamino) zirconium (TEMAZ) is liquid under room temperature and atmospheric pressure.

A gas containing oxygen (oxygen-containing gas) such as $O_2$ gas is supplied to the gas supply pipe 232b, and is then converted into $O_3$ gas by the ozonizer 500. $O_3$ gas is supplied as an oxidizing gas (oxidizing agent) into the process chamber 201 through the valve 243f, the MFC 241b and the valve 243b. $O_2$ gas, which is also an oxidizing gas, may be directly supplied into the process chamber 201 in place of $O_3$ gas generated by the ozonizer 500.

The inert gas such as nitrogen ($N_2$) gas is supplied into the process chamber 201 via the gas supply pipes 232c and 232e provided with the MFCs 241c and 241e and the valves 243c and 243e, the gas supply pipes 232a and 232b and the nozzles 249a and 249b, respectively.

An exhaust pipe 231 for exhausting the inner atmosphere of the process chamber 201 is provided at the lower sidewall of the reaction tube 203. A vacuum pump 246 which is a vacuum exhaust mechanism is connected to the exhaust pipe 231 through a pressure sensor 245 and an APC (Automatic Pressure Controller) valve 244. The pressure sensor 245 serves as a pressure detector (pressure detection mechanism) which detects the inner pressure of the process chamber 201, and the APC valve 244 serves as a pressure controller (pressure adjusting mechanism). With the vacuum pump 246 in operation, the APC valve 244 may be opened/closed to vacuum-exhaust the process chamber 201 or stop the vacuum exhaust. With the vacuum pump 246 in operation, the opening degree of the APC valve 244 may be adjusted in order to control the inner pressure of the process chamber 201. The exhaust pipe 231, the APC valve 244, the vacuum pump 246 and the pressure sensor 245 constitutes an exhaust system.

A temperature sensor 263, which is a temperature detector, is provided in the reaction tube 203. The energization state of the heater 207 is controlled based on the temperature detected by the temperature sensor 263 such that the inner temperature of the process chamber 201 has a desired temperature distribution. The temperature sensor 263 is L-shaped similar to the nozzles 249a and 249b. The temperature sensor 263 is provided along the inner wall of the reaction tube 203.

Figure 11:
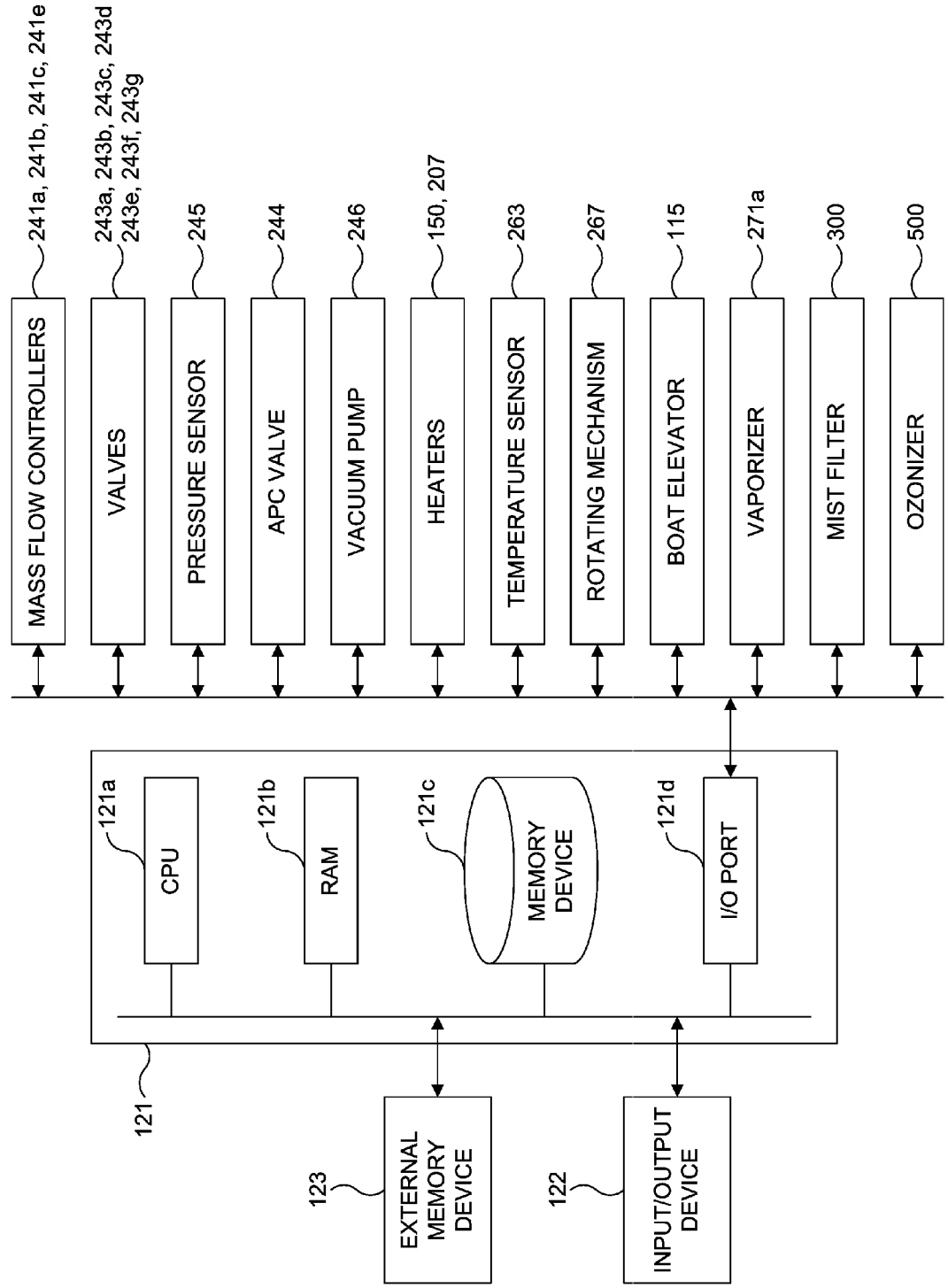
FIG. 11 is a block diagram schematically illustrating a configuration of a controller and components controlled by the controller of the substrate processing apparatus shown in FIG. 9.

As shown in FIG. 11, the controller 121 which is a control device (control means) is embodied by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an input/output device 122 such as a touch panel is connected to the controller 121. An external memory device (recording medium) 123 connected to the controller 121 stores a program, which will be described later.

The memory device 121c is embodied by components such as a flash memory and HDD (Hard Disk Drive). A control program for controlling the operation of the substrate processing apparatus or a process recipe containing information on the sequence and conditions of a substrate processing described later is readably stored in the memory device 121c. The external memory device 123 may store the control program or the process recipe. By connecting the external memory device 123 to the controller 121, the control program or the process recipe may be transferred to and readably stored in the memory device 121c. The process recipe is obtained by combining steps of the substrate processing described later such that the controller 121 may execute the steps to acquire a predetermine result, and functions as a program. Hereafter, the process recipe and the control program are collectively referred to as a program. In this specification, "program" may indicate only the process recipe, indicate only the control program, or indicate both of them. The RAM 121b is a work area where a program or data read by the CPU 121a is temporarily stored.

The I/O port 121d is connected to the above-described components such as the mass flow controllers (MFCs) 241a, 241b, 241c and 241e, the valves 243a, 243b, 243c, 243d, 243e, 243f and 243g, the vaporizer 271a, the mist filter 300, the ozonizer 500, the pressure sensor 245, the APC valve 244, the vacuum pump 246, the heaters 150 and 207, the temperature sensor 263, the rotating mechanism 267 and the boat elevator 115.

The CPU 121a is configured to read a control program from the memory device 121c and execute the read control program. Furthermore, the CPU 121a is configured to read a process recipe from the memory device 121c according to an operation command inputted from the input/output device 122. According to the contents of the read process recipe, the CPU 121a may be configured to control various operations such as flow rate adjusting operations for various gases by the mass flow controllers (MFCs) 241a, 241b, 241c and 241e, opening/closing operations of the valves 243a, 243b, 243c, 243d, 243e, 243f and 243g, an opening/closing operation of the APC valve 244, a pressure adjusting operation by the APC valve 244 based on the pressure sensor 245, a temperature adjusting operation of the heater 150, a temperature adjusting operation of the heater 207 based on the temperature sensor 263, controlling operations of the vaporizer 271a, the mist filter 300, the heater 360 and the ozonizer 500, a start and stop of the vacuum pump 246, a rotation speed adjusting operation of the rotating mechanism 267 and an elevating operation of the boat 217 by the boat elevator 115.

Next, an example film-forming sequence of forming an insulating film on a substrate, which is a substrate processing for manufacturing a semiconductor device, using the above-described substrate processing apparatus will be described with reference to FIGS. 12 and 13. Herein, the components of the substrate processing apparatus are controlled by the controller 121.

According to the CVD (Chemical Vapor Deposition) method, for example, multiple types of gases including a plurality of elements constituting a film to be formed are simultaneously supplied. According to another film forming method, multiple types of gases including a plurality of elements constituting the film to be formed may be alternately supplied.

Figure 12:
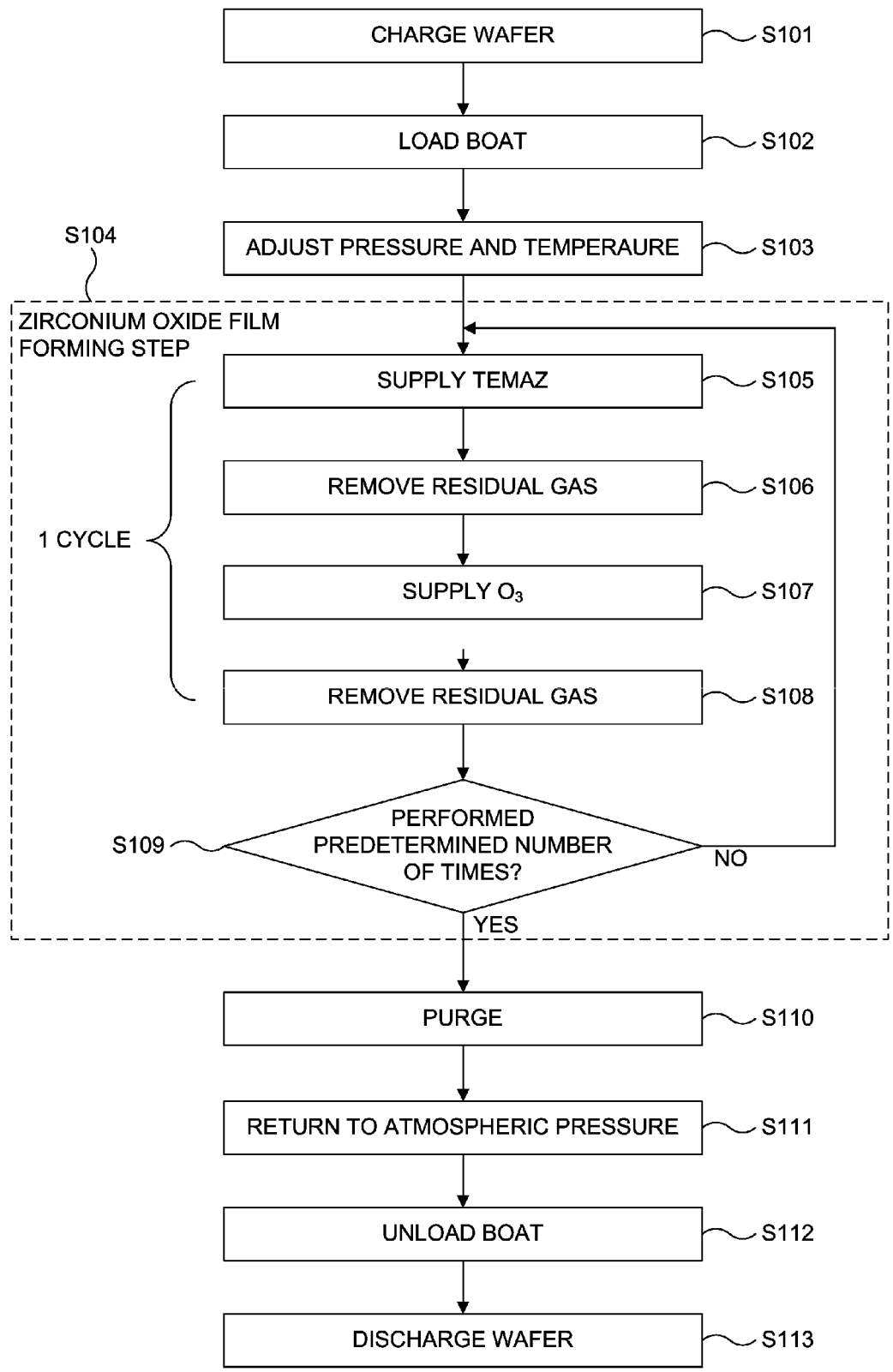
FIG. 12 is a flowchart illustrating a process for forming a zirconium oxide film using the substrate processing apparatus according to the embodiment

Wafers 200 are charged into the boat 217 (wafer charging: step S101 of FIG. 12). The boat 217 charged with the wafers 200 as shown in FIG. 9 is lifted by the boat elevator 115 and loaded into the process chamber 201 (boat loading: step S102 of FIG. 12). With the boat 217 loaded, the seal cap 219 seals the lower end of the reaction tube 203 via the O-ring 220b.

The vacuum pump 246 vacuum-exhausts the process chamber 201 such that the inner pressure of the process chamber 201 is set to a desired pressure (vacuum level). Simultaneously, the inner pressure of the process chamber 201 is measured by the pressure sensor 245, and the APC valve 244 is feedback controlled based on the measured pressure (pressure adjusting: step S103 of FIG. 12). The heater 207 heats the process chamber 201 such that the inner temperature of the process chamber 201 becomes a desired temperature. The energization state of the heater 207 is feedback controlled based on the temperature detected by the temperature sensor 263 such that the inner temperature of the process chamber 201 has a desired temperature distribution (temperature adjusting: step S103 of FIG. 12). The rotating mechanism 267 starts to rotate the boat 217 and the wafers 200.

Next, an insulating film forming process (zirconium oxide film forming process: step S104 OF FIG. 12) for forming a ZrO film, which is an insulating film, is performed by supplying TEMAZ gas and $O_3$ gas to the process chamber 201. Steps S105 through S108 are performed sequentially in the insulating film forming process.

<Insulating Film Forming Process>
<Step S105>

Figure 13:
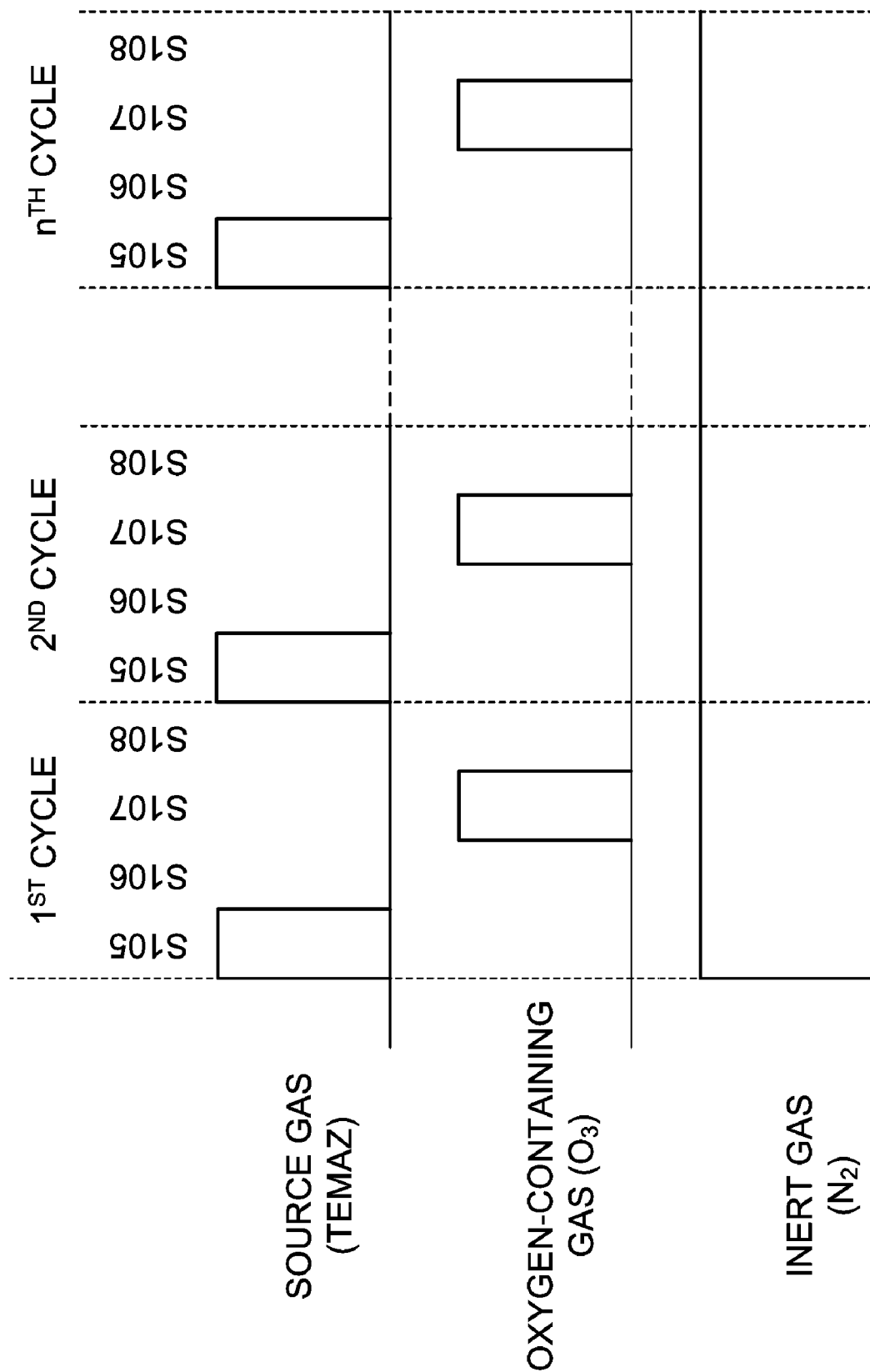
FIG. 13 is a timing diagram of supplying gases in the process for forming the zirconium oxide film using the substrate processing apparatus according to the embodiment

In the step S105 (first step), as shown in FIGS. 12 and 13, TEMAZ gas is supplied to the wafers 200 in the process chamber 201. By opening the valve 243a at the gas supply pipe 232a and closing the valve 243d at the ventilation line 232d, TEMAZ gas is supplied to the gas supply pipe 232a through the vaporizer 271a, the mist filter 300 and the gas filter 272a. After the flow rate of TEMAZ gas is adjusted by the MFC 241a, the TEMAZ gas is supplied into the process chamber 201 through the gas supply holes 250a of the nozzle 249a and exhausted through the exhaust pipe 231. Simultaneously, the valve 243c is opened to supply an inert gas such as $N_2$ gas into the inert gas supply pipe 232c. After the flow rate of $N_2$ gas is adjusted by the MFC 241c, the $N_2$ gas is supplied along with the TEMAZ gas into the process chamber 201 and exhausted through the exhaust pipe 231. A zirconium-containing layer is formed on the wafer by the reaction between TEMAZ gas supplied into the process chamber 201 and the wafer 200. Before the step S105 is performed, the heater 360 of the mist filter 300 is controlled such that the temperature of the mist filter body 350 is maintained at a desired temperature.

Simultaneously, the APC valve 244 is controlled such that the inner pressure of the process chamber 201 ranges, for example, from 50 Pa to 400 Pa. The flow rate of the TEMAZ gas adjusted by the MFC 241a such that the flow rate of TEMAZ gas ranges, for example, from 0.1 g/min to 0.5 g/min. The duration of the exposure of the wafer 200 to TEMAZ gas, i.e. the time duration of supply of the TEMAZ gas onto the wafers 200, ranges, for example, from 30 second to 240 seconds. The temperature of the heater 207 is controlled such that the temperature of the wafers 200 may range, for example, from 150° C. to 250° C.

<Step S106>

In the step S106 (second step), After the zirconium-containing layer is formed in the step S105, the valve 243a is closed and the valve 243d is opened to stop the supply of the TEMAZ gas into the process chamber 201 and to supply the TEMAZ gas to the ventilation line 232d as shown in FIGS. 12 and 13. With the APC valve 244 of the exhaust pipe 231 open, the vacuum pump 246 vacuum-exhausts the interior of the process chamber 201 to remove residual TEMAZ gas which did not react or contributed to the formation of the zirconium-containing layer from the process chamber 201. By maintaining the valves 243c open, the $N_2$ gas is continuously supplied into the process chamber 201. The $N_2$ gas is continuously supplied into the process chamber 201 to improve an effect of removing the residual TEMAZ gas which did not react or contributed to the formation of the zirconium-containing layer from the process chamber 201. While the $N_2$ gas is exemplified as the inert gas, rare gases such as argon (Ar) gas, helium (He) gas, neon (Ne) gas and xenon (Xe) gas may be used as the inert gas instead of the $N_2$ gas.

<Step S107>

After the residual TEMAZ gas is removed from the process chamber 201 in the step S106, $O_2$ gas is supplied to the gas supply pipe 232b as shown in FIGS. 12 and 13. The $O_2$ gas supplied to the gas supply pipe 232b is converted to $O_3$ gas by the ozonizer 500. By opening the valve 243f at the gas supply pipe 232b and closing the valve 243g at the ventilation line 232g, the flow rate of $O_3$ gas is adjusted by the MFC 241b. The $O_3$ gas with the flow rate thereof adjusted by the MFC 241b is supplied into the process chamber 201 through the plurality of gas supply holes 250b of the nozzle 249b and then exhausted through the exhaust pipe 231. Simultaneously, the valve 243e is opened to supply an inert gas such as $N_2$ gas into the inert gas supply pipe 232e. The $N_2$ gas is supplied along with the $O_3$ gas into the process chamber 201 and then exhausted through the exhaust pipe 231. A zirconium oxide (ZrO) layer is formed by the reaction between the zirconium-containing layer formed on the wafer 200 and the $O_3$ gas supplied into the process chamber 201.

At this time, the APC valve 244 is controlled such that the inner pressure of the process chamber 201 may range, for example, from 50 Pa to 400 Pa. The flow rate of the $O_3$ gas adjusted by the MFC 241b may range from 10 slm to 20 slm. The duration of the exposure of the wafer 200 to $O_3$ gas, i.e. the time duration of supply of the $O_3$ gas onto the wafers 200, ranges, for example, from 30 second to 300 seconds. The temperature of the heater 207 is controlled such that the temperature of the wafers 200 may range, for example, from 150° C. to 250° C.

<Step S108>

In the step S108 (fourth step), the valve 243b at the gas supply pipe 232b is closed to stop the supply of the $O_3$ gas into the process chamber 201 and the valve 243g is opened to supply the $O_3$ gas to the ventilation line 232g. With the APC valve 244 at the exhaust pipe 231 open, the vacuum pump 246 vacuum-exhausts the interior of the process chamber 201 to remove residual $O_3$ gas which did not react or contributed to the formation of the zirconium oxide layer from the process chamber 201. By maintaining the valves 243e open, the $N_2$ gas is continuously supplied into the process chamber 201. The $N_2$ gas is continuously supplied into the process chamber 201 to improve an effect of removing the residual $O_3$ gas which did not react or contributed to the formation of the zirconium oxide layer from the process chamber 201. While the $O_3$ gas is exemplified as the oxygen-containing gas, gas such as $O_2$ gas may be used as the oxygen-containing gas instead of the $O_3$ gas.

In the step S109, the zirconium oxide film having a desired thickness may be formed on the wafers 200 by performing a cycle including the first step S105 through the fourth step S108 at least once. It is preferable that the cycle is performed a plurality of times to form the zirconium oxide film having the desired thickness is formed on the wafers 200.

After the zirconium oxide film is formed on the wafers 200, the valve 243a at the gas supply pipe 232a and the valve 243b at the gas supply pipe 232b are closed and the valve 243c at the inert gas supply pipe 232c and the valve 243e of the inert gas supply pipe 232e are opened to supply the $N_2$ gas into the process chamber 201. The $N_2$ gas serves as a purge gas. The process chamber 201 is thereby purged such that the gas remaining in the process chamber 201 is removed from the process chamber 201 (purging step S110).

Thereafter, the inner atmosphere of the process chamber 201 is replaced with the inert gas, and the inner pressure of the process chamber 38 is returned to atmospheric pressure (returning to atmospheric pressure: step S111).

Thereafter, the seal cap 219 is lowered by the boat elevator 115 and the lower end of the reaction tube 203 is opened. The boat 217 with the processed wafers 200 charged therein is unloaded from the reaction tube 203 through the lower end of the reaction tube 203 (boat unloading: step S112). After the boat 217 is unloaded, the processed wafers 200 are then discharged from the boat 217 (wafer discharging: step S113).

<Simulation Results>

Figure 7:
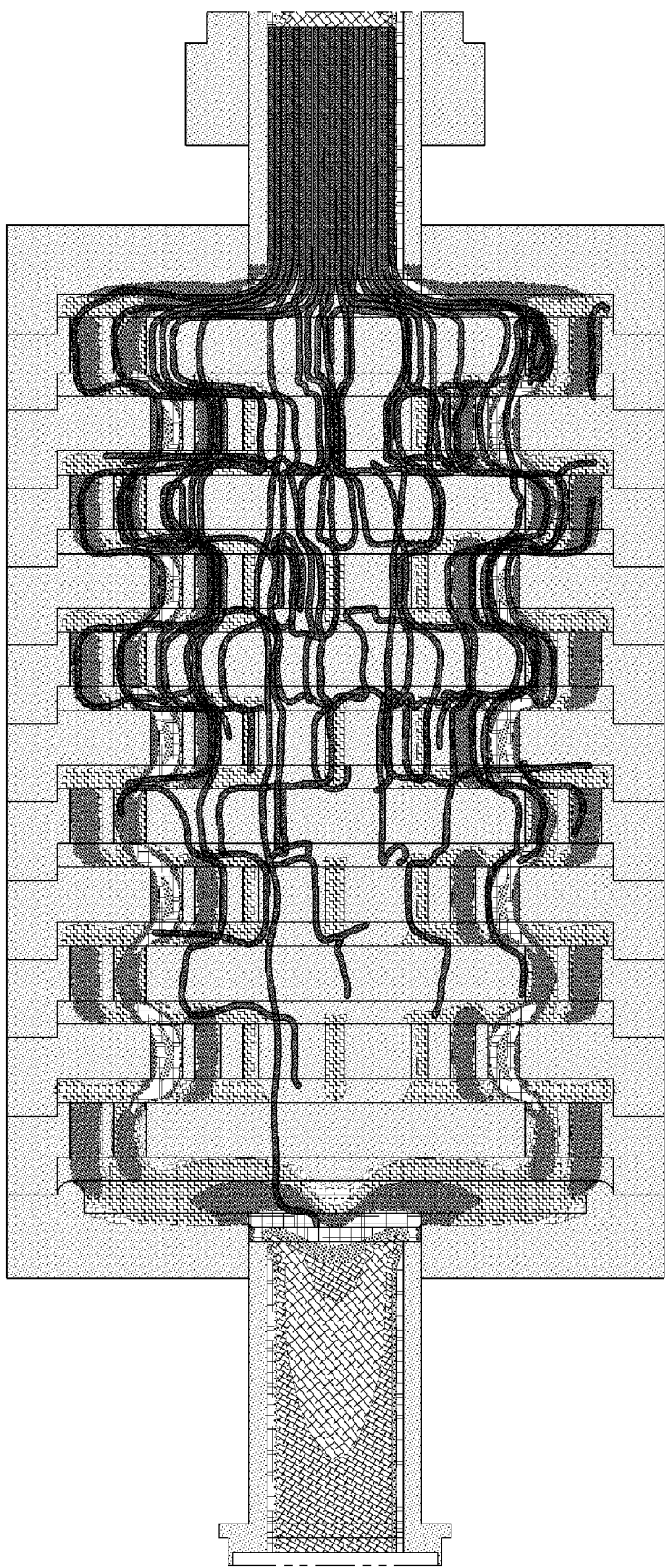
FIG. 7 illustrates a flow velocity of a source gas flowing in the mist filter of the source supply system according to the embodiment.
Figure 8:
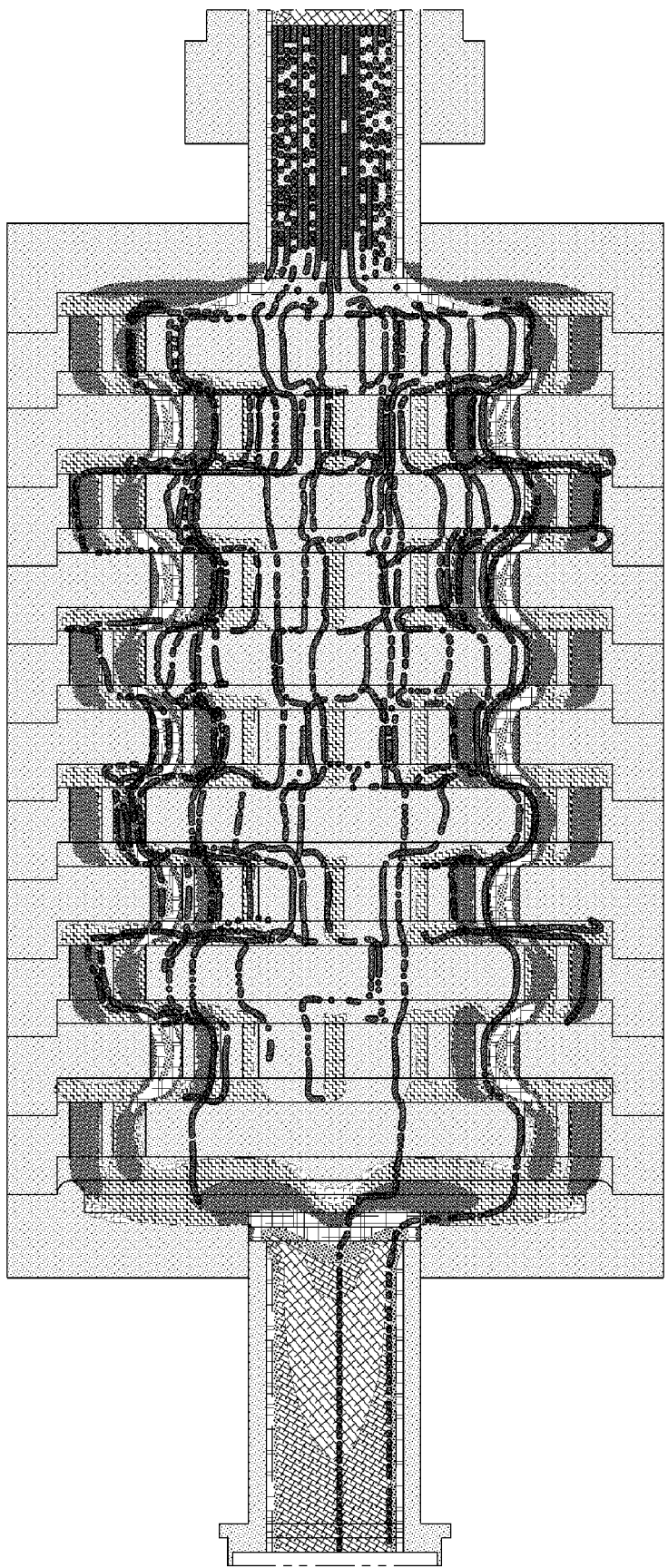
FIG. 8 illustrates a flow velocity of a source gas flowing in a conventional mist filter for comparison.

FIGS. 7 and 8 are graphs showing the results of simulation of the flow velocity of the droplets in the mist filter 300. The simulation was performed assuming that the gas pressure was 34,000 Pa, the temperature of the mist filter 300 was 170° C., and the total flow rate supplied by the vaporizer was 28 slm. The path of 170 droplets having a diameter of 50 μm and the density of 3 g/cm$^3$ from the introduction into the mist filter 300 to extinction in the mist filter 300 is shown as lines in FIGS. 7 and 8. Although not indicated in FIGS. 7 and 8, the length of the path and the time duration of the droplets from the introduction into the mist filter 300 to extinction in the mist filter 300 may be obtained. According to the simulation results of the mist filter 300 of the embodiment shown in FIG. 7, none of the 170 droplets introduced through the end plate 310 passes through the end plate 340. That is, the droplets having a diameter equal to or greater than 50 μm are completely eliminated in the mist filter 300. According to the simulation results of a conventional mist filter shown in FIG. 8, a small amount of droplets reaches the gas path 341 in the outlet side 340. The time duration of the droplets is 0.035 seconds in the conventional mist filter while the time duration of the droplets is 0.0026 seconds in the mist filter 300 of the embodiment. Therefore, according to the embodiment, it is be confirmed that the droplets are collected 10 times faster in the mist filter 300 compared to the conventional mist filter.

FIG. 6 is a partial enlarged view of the simulation results shown in FIG. 7 showing the flow of gas near the grooves 325 and 335 in particular. The grooves 325 and 335 having width of 0.4 mm and depth of 0.5 mm are exemplified. Referring to FIG. 6 and the simulation results, it can be seen that the flow velocity of the droplets flowing on the surface is reduced when grooves 325 and 335 are provided. The reduction of the flow velocity of droplets means that the velocity of droplets changes from a higher velocity (before entering the grooves 325 and 335) to a lower velocity (after entering the grooves 325 and 335). This prolongs the time during which the droplets stay in the grooves 325 and 335 such that the droplets absorb more heat required for vaporization.

Referring to FIG. 6, the droplets that do not enter the grooves 325 and 335 in perpendicular direction flow into the grooves 325 and 335 in the direction shown in FIG. 6 considering the gas flow. Considering the flow velocity, although the rate of the droplets with small diameters colliding onto the grooves 325 and 335 is lower than that of the droplets with large diameters colliding onto the grooves 325 and 335, it takes a certain amount of time for the droplets with small diameters to escape from the grooves 325 and 335 once the droplets with small diameters enters the grooves 325 and 335.

As described above, one or more advantageous effects described below are provided according to the embodiment.

(a) According to the embodiment, incomplete vaporization, which occurs when a liquid source is difficult to vaporize or the flow rate of the liquid source is high, may be suppressed.

(b) According to the embodiment, the vaporization efficiency of the source may be improved by increasing the surface area of the plate into which the source in mist state collides. In addition, the vaporization efficiency may be improved remarkably by forming a vortex of the source in mist state in the groove.

(c) According to the embodiment, the mist filter is constructed by combining at least two types of plates each having grooves at a location facing the source in mist state that passed through the holes in the plates. The two plates have grooves at different locations such that the length of the gas path in the mist filter can be increased. The grooves provided along the path of source in mist state between the plates improve the efficiency of collecting mist. Particularly, the grooves reduce the flow velocity of the mist, and the vaporization efficiency of the mist introduced into the groove is improved.

(d) According to the embodiment, the mist filter is constructed by combining at least two types of plates each having grooves at a location facing the source in mist state that passed through the holes in the plates. The two plates have grooves at different locations such that the length of the gas path between the plates is longer in the direction parallel to the surfaces of the plates than in the direction perpendicular to the surfaces of the plates to increase the overall length of the gas path. The grooves improve the efficiency of collecting mist by prolonging the time during which the mist stays in the mist filter to apply sufficient heat to the mist for vaporization.

(e) According to the embodiment, the droplets having large diameters may be completely collected prior to the gas filter. For example, the vaporizer and the mist filter may be provided at the upstream side of the gas filter. The droplets are aggregated and converted into a liquid residue in the mist filter, and the solid residue, which acts as undesired particle, may be generated due to slow vaporization of the liquid residue. However, the solid residues may be completely collected by the gas filter according to the embodiment.

(f) According to the embodiment, the clogging of the gas filter may be suppressed such that the gas filter may be maintenance-free and the life of the gas filter may be prolonged. A film may be formed under a condition free of particles.

While the above-described embodiment is exemplified by way of a formation of a ZrO film, the above-described technique wherein the mist filter 300 is used may also be applied to the formation of a high-k (high dielectric constant) film such as HfO film as well as ZrO film and to the formation of films in which gases prone to incomplete vaporization or gases of high flow rate are used. In particular, the above-described technique may also be applied to the formation of films in which liquid source having a low vapor pressure is used, The above-described technique wherein the mist filter 300 is used may be applied to a formation of a film such as a metal carbide film containing at least one metal element, a metal nitride film containing at least one metal element and a silicide film obtained by adding silicon (Si) to the above-described metal carbide film or the above-described metal nitride film. The metal element may include titanium (Ti), tantalum (Ta), cobalt (Co), tungsten (W), molybdenum (Mo), ruthenium (Ru), yttrium (Y), lanthanum (La), zirconium (Zr), hafnium (Hf) and nickel (Ni). Material such as titanium chloride ($TiCl_4$), tetrakis dimethylamino titanium (TDMAT, $Ti[N(CH_3)_2]_4$) and tetrakis diethylamino titanium (TDEAT, $Ti[N(CH_2CH_3)_2]_4$) may be used as a source containing titanium. Material such as tantalum chloride ($TaCl_4$) may be used as a source containing tantalum. Material such as CoAMD (($tBu)NC(CH_3)N(tBu)_2Co$) may be used as a source containing cobalt. Material such as tungsten fluoride ($WF_6$) may be used as a source containing tungsten. Material such as molybdenum chloride ($MoCl_3$ or $MoCl_5$) may be used as a source containing molybdenum. Material such as 2,4-dimethylpentadienyl (ethylcyclopentadienyl) ruthenium ($Ru(EtCp)(C_7H_{11})$) may be used as a source containing ruthenium. Material such as tris ethylcyclopentadienyl yttrium ($Y(C_2H_5C_5H_4)_3$) may be used as a source containing yttrium. Material such as tris isopropyl cyclopentadienyl lanthanum ($La(i-C_3H_7C_5H_4)_3$) may be used as a source containing lanthanum. Material such as tetrakis ethylmethylamino zirconium ($Zr\{N[CH_3(C_2H_5)]_4\}$) may be used as a source containing zirconium. Material such as tetrakis ethylmethylamino hafnium ($Hf\{N[CH_3(C_2H_5)]_4\}$) may be used as a source containing hafnium. Material such as nickel amidinate (NiAMD), cyclopentadienyl allyl nickel ($C_5H_5NiC_3H_5$), methyl cyclopentadienyl allyl nickel (($CH_3)C_5H_4NiC_3H_5$), ethyl cyclopentadienyl allyl nickel (($C_2H_5)C_5H_4NiC_3H_5$) and $Ni(PF_3)_4$ may be used as a source containing nickel. Material such as tetrachlorosilane ($SiCl_4$), hexachlorodisilane ($Si_2Cl_6$), dichlorosilane ($SiH_2Cl_2$), tris dimethylamino silane ($SiH[N(CH_3)_2]_3$) 3) and bis (tertiary-butylamino) silane ($H_2Si[HNC(CH_3)_2]_2$) may be used as a source containing nickel.

As the metal carbide film containing titanium, a film such as TiCN film or TiAlC film may be used. As a source of the TiCN film, for example, material such as $TiCl_4$, $Hf[C_5H_4(CH_3)]_2(CH_3)_2$ and $NH_3$ may be used. As a source of the TiAlC film, for example, material such as $TiCl_4$ and trimethyl aluminum (TMA, $(CH_3)_3Al$) may be used. Material such as TMA and propylene ($C_3H_6$) may also be used as the source of the TiAlC film. As the metal nitride film containing titanium, a film such as TiAlN film may be used. As a source of the TiAlN film, for example, material such as $TiCl_4$, TMA and $NH_3$ may be used.

While the technique is described in detail by way of the above-described embodiments, the above-described technique is not limited thereto. The above-described technique may be modified in various ways without departing from the gist thereof. Accordingly, the scope of the above-described technique is limited only by the claims.

According to the technique described herein, liquid source may be efficiently vaporized and supplied to the process chamber.

What is claimed is:

1. A substrate processing apparatus comprising:
a process chamber accommodating a substrate;
a process gas supply system configured to supply a process gas into the process chamber; and
an exhaust system configured to exhaust the process chamber;
wherein the process gas supply system comprises: a vaporizer and a mist filter provided at a downstream side of the vaporizer, the mist filter comprising: a plurality of first plates and a plurality of second plates, each of the plurality of first plates comprising: a first plate portion provided with a plurality of first grooves provided on a surface thereof and a first flow path wherethrough a source in mist state flows, each of the plurality of second plates comprising: a second plate portion provided with a plurality of second grooves provided on a surface thereof and a second flow path wherethrough the source in mist state flows, and
wherein when the plurality of first plates and the plurality of second plates are arranged alternately, the plurality of first grooves are configured to face the second flow path and the plurality of second grooves are configured to face the first flow path, such that the first flow path and the second flow path are not in-line,
wherein each of the plurality of first grooves is one of V-shaped, rectangular, trapezoidal and U-shaped such that the surface where the plurality of first grooves are provided is uneven, and each of the plurality of second grooves is one of V-shaped, rectangular, trapezoidal and U-shaped such that the surface where the plurality of second grooves are provided is uneven, and
wherein a depth-to-width ratio of each of the plurality of first grooves ranges from 0.5 to 2, and a depth-to-width ratio of each of the plurality of second grooves ranges from 0.5 to 2.

2. The substrate processing apparatus of claim 1, wherein the plurality of first plates and the plurality of second plates are alternately arranged, the plurality of first grooves are provided at a center portion of each of the first plate portion, and the plurality of second grooves are provided at a peripheral portion of each of the second plate portion.

3. A substrate processing apparatus comprising:
a process chamber accommodating a substrate;
a process gas supply system configured to supply a process gas into the process chamber; and
an exhaust system configured to exhaust the process chamber;
wherein the process gas supply system comprises: a vaporizer and a mist filter provided at a downstream side of the vaporizer, the mist filter comprising: a plurality of first plates and a plurality of second plates, each of the plurality of first plates comprising: a first plate portion provided with a plurality of first grooves provided on a surface thereof and a first flow path wherethrough a source in mist state flows, each of the plurality of second plates comprising: a second plate portion provided with a plurality of second grooves provided on a surface thereof and a second flow path wherethrough the source in mist state flows, and
wherein when the plurality of first plates and the plurality of second plates are arranged alternately, the plurality of first grooves are configured to face the second flow path and the plurality of second grooves are configured to face the first flow path, such that the first flow path and the second flow path are not in-line,
wherein each of the plurality of first grooves is one of V-shaped, rectangular, trapezoidal and U-shaped such that the surface where the plurality of first grooves are provided is uneven, and each of the plurality of second grooves is one of V-shaped, rectangular, trapezoidal and U-shaped such that the surface where the plurality of second grooves are provided is uneven, and
wherein an opening angle of each of the plurality of first grooves ranges from 60 to 120 degrees, and an opening angle of each of the plurality of second grooves ranges from 60 to 120 degrees.

4. The substrate processing apparatus of claim 1, wherein the plurality of first grooves are concentrically arranged with respect to a center of each of the plurality of first plates at equal distance therebetween, and the plurality of second grooves are concentrically arranged with respect to a center of each of the plurality of second plates at equal distance therebetween.

5. The substrate processing apparatus of claim 1, wherein a peripheral portion of the first plate portion is provided with a plurality of first holes defining the first flow path and a center portion of the first plate portion is provided with the plurality of first grooves, and a center portion of the second plate portion is provided with a plurality of second holes defining the second flow path and a peripheral portion of the second plate portion is provided with the plurality of second grooves, and wherein each of the plurality of first plates further comprises a first circumferential portion thicker than the first plate portion and provided along the peripheral portion of the first plate portion, and each of the plurality of second plates further comprises a second circumferential portion thicker than the second plate portion and provided along the peripheral portion of the second plate portion such that a space is defined between the first plate portion and the second the plate portion when the plurality of first plates and the plurality of second plates are alternately arranged with the first circumferential portion in contact with the second circumferential portion.

6. The substrate processing apparatus of claim 1, wherein a peripheral portion of the first plate portion is provided with a plurality of first holes defining the first flow path, a center portion of the second plate portion is provided with a plurality of second holes defining the second flow path and the plurality of first plates and the plurality of second plates are alternately arranged.

7. The substrate processing apparatus of claim 1, wherein the process gas supply system further comprises a gas filter provided at a downstream side of the mist filter.

8. The substrate processing apparatus of claim 7, wherein the vaporizer, the mist filter and the gas filter are separable from one another.

9. The substrate processing apparatus of claim 1, wherein the mist filter further comprises a heater configured to heat at least the plurality of first plates and the plurality of second plates.

10. The substrate processing apparatus of claim 1, wherein each of the plurality of first plates and the plurality of second plates is made of metal.

11. The substrate processing apparatus of claim 1, wherein the plurality of first plates and the plurality of second plates have a same shape except locations of the plurality of first grooves, the plurality of second grooves, a plurality of first holes defining the first flow path and a plurality of second holes defining the second flow path.

12. A vaporizer system comprising:
a vaporizer; and
a mist filter provided at a downstream side of the vaporizer, the mist filter comprising: a plurality of first plates and a plurality of second plates, each of the plurality of first plates comprising: a first plate portion provided with a plurality of first grooves provided on a surface thereof and a first flow path wherethrough a source in mist state flows, each of the plurality of second plates comprising: a second plate portion provided with a plurality of second grooves provided on a surface thereof and a second flow path wherethrough the source in mist state flows, and wherein when the plurality of first plates and the plurality of second plates are arranged alternately, the plurality of first grooves are configured to face the second flow path and the plurality of second grooves are configured to the first flow path, such that the first flow path and the second flow path are not in-line, wherein each of the plurality of first grooves is one of V-shaped, rectangular, trapezoidal and U-shaped such that the surface where the plurality of first grooves are provided is uneven, and each of the plurality of second grooves is one of V-shaped, rectangular, trapezoidal and U-shaped such that the surface where the plurality of second grooves are provided is uneven, and wherein a depth-to-width ratio of each of the plurality of first grooves ranges from 0.5 to 2, and a depth-to-width ratio of each of the plurality of second grooves ranges from 0.5 to 2.

13. A mist filter comprising:
a plurality of first plates wherein each of the plurality of first plates comprises a first plate portion provided with a plurality of first grooves provided on a surface thereof and a first flow path wherethrough a source in mist state flows; and
a plurality of second plates wherein each of the plurality of second plates comprises a second plate portion provided with a plurality of second grooves provided on a surface thereof and a second flow path wherethrough the source in mist state flows, wherein when the plurality of first plates and the plurality of second plates are arranged alternately, the plurality of first grooves are configured to face the second flow path and the plurality of second grooves are configured to face the first flow path, such that the first flow path and the second flow path are not in-line, wherein each of the plurality of first grooves is one of V-shaped, rectangular, trapezoidal and U-shaped such that the surface where the plurality of first grooves are provided is uneven, and each of the plurality of second grooves is one of V-shaped, rectangular, trapezoidal and U-shaped such that the surface where the plurality of second grooves are provided is uneven, and wherein a depth-to-width ratio of each of the plurality of first grooves ranges from 0.5 to 2, and a depth-to-width ratio of each of the plurality of second grooves ranges from 0.5 to 2.

* * * * *